(12) United States Patent
Ota et al.

(10) Patent No.: US 9,988,708 B2
(45) Date of Patent: Jun. 5, 2018

(54) DYEING METHOD AND APPARATUS FOR DYEING RESIN BODY BY VAPORIZATION AND DEPOSITION

(71) Applicant: NIDEK CO., LTD., Aichi (JP)

(72) Inventors: Yasuo Ota, Aichi (JP); Minoru Inuzuka, Aichi (JP); Atsushi Yano, Aichi (JP); Motoshi Tanaka, Aichi (JP)

(73) Assignee: NIDEK CO., LTD., Gamagori-shi, Aichi (JP)

( * ) Notice: Subject to any disclaimer, the term of this patent is extended or adjusted under 35 U.S.C. 154(b) by 0 days. days.

(21) Appl. No.: 14/768,500

(22) PCT Filed: Feb. 18, 2014

(86) PCT No.: PCT/JP2014/053697
§ 371 (c)(1),
(2) Date: Aug. 18, 2015

(87) PCT Pub. No.: WO2014/129435
PCT Pub. Date: Aug. 28, 2014

(65) Prior Publication Data
US 2016/0002768 A1 Jan. 7, 2016

(30) Foreign Application Priority Data

Feb. 19, 2013 (JP) ................................. 2013-029615
Feb. 19, 2013 (JP) ................................. 2013-029616
Feb. 19, 2013 (JP) ................................. 2013-029617

(51) Int. Cl.
*B05C 11/00* (2006.01)
*B05C 13/00* (2006.01)
(Continued)

(52) U.S. Cl.
CPC ........ *C23C 14/24* (2013.01); *B29D 11/00903* (2013.01); *B29D 11/00923* (2013.01);
(Continued)

(58) Field of Classification Search
None
See application file for complete search history.

(56) References Cited

U.S. PATENT DOCUMENTS 5,514,214 A * 5/1996 Joel .................. B29D 11/00865
118/300
5,820,673 A * 10/1998 Sentilles .......... B29D 11/00865
118/319
(Continued)

FOREIGN PATENT DOCUMENTS

CN 101987320 A 3/2011
JP 01-119662 A 5/1989
(Continued)

OTHER PUBLICATIONS

Search Report dated May 20, 2014, issued by the International Searching Authority in counterpart International Application No. PCT/JP2014/053697.
(Continued)

*Primary Examiner* — Binu Thomas
(74) *Attorney, Agent, or Firm* — Sughrue Mion, PLLC

(57) ABSTRACT

A dyeing device dyes a resin body by vaporizing and depositing a sublimation dye adhered to a dyeing base to a resin body and fixing the dye to the resin body. The dyeing device lowers the pressure inside a closed chamber that closes the periphery of the resin body by a pump. In the state where the adhesion surface of the dyeing base to which the dye is adhered faces the resin body without contact, by heating the dye adhered to the dyeing base inside the closed chamber of which the pressure is lowered, the dye is sublimated, vaporized, and deposited on the resin body. The pressure inside the closed chamber is raised higher than the pressure at the vaporizing and depositing time. By irradiating the resin body on which the dye is vaporized and
(Continued)

deposited with electromagnetic wave, the resin body is heated and the dye is and fixed.

7 Claims, 10 Drawing Sheets

(51) Int. Cl.
*D06P 5/20* (2006.01)
*B29D 11/00* (2006.01)
*G02B 1/10* (2015.01)
*C23C 16/46* (2006.01)
*C23C 14/24* (2006.01)
*C23C 14/50* (2006.01)
*G02B 1/04* (2006.01)
*G02B 1/12* (2006.01)
*C23C 14/28* (2006.01)
*D06P 5/28* (2006.01)
*D06P 5/13* (2006.01)
*C23C 14/54* (2006.01)

(52) U.S. Cl.
CPC .............. *C23C 14/28* (2013.01); *C23C 14/50* (2013.01); *C23C 14/54* (2013.01); *C23C 14/541* (2013.01); *C23C 14/542* (2013.01); *D06P 5/004* (2013.01); *D06P 5/13* (2013.01); *D06P 5/20* (2013.01); *G02B 1/041* (2013.01); *G02B 1/10* (2013.01); *G02B 1/12* (2013.01)

(56) References Cited

U.S. PATENT DOCUMENTS

| | | | |
|---|---|---|---|
| 6,520,999 B1* | 2/2003 | Kamata | D06P 5/004 427/162 |
| 6,726,463 B2* | 4/2004 | Foreman | B29D 11/00442 425/174.4 |
| 2008/0078037 A1* | 4/2008 | Inuzuka | D06P 5/004 118/696 |
| 2008/0276386 A1* | 11/2008 | Inuzuka | D06P 5/004 118/641 |
| 2011/0023243 A1* | 2/2011 | Kubotera | B29D 11/00903 118/504 |
| 2012/0311797 A1* | 12/2012 | Inuzuka | D06P 5/004 118/712 |

FOREIGN PATENT DOCUMENTS

| | | |
|---|---|---|
| JP | 01-277814 A | 11/1989 |
| JP | 08-043601 A | 2/1996 |
| JP | 08-043602 A | 2/1996 |
| JP | 2008-281729 A | 11/2008 |
| JP | 2008-288451 A | 11/2008 |
| JP | 2011-075690 A | 4/2011 |
| JP | 4802138 B2 | 10/2011 |

OTHER PUBLICATIONS

Communication dated Oct. 17, 2016 issued by the State Intellectual Property Office of P.R. China in counterpart Chinese Application No. 201480009527.9.

* cited by examiner

| | PART (THICKNESS) DISTANCE, VOLTAGE | A (2.30mm) | B (2.30mm) | C (2.30mm) |
|---|---|---|---|---|
| CRS-0.00 | 30mm, 100V | 66.6°C | 120.0°C | 120.4°C |
| | 40mm, 125V | 104.5°C | 139.5°C | 140.9°C |
| | 50mm, 125V | 121.4°C | 118.5°C | 111.3°C |
| | 60mm, 150V | 143.3°C | 124.6°C | 104.4°C |
| | 70mm, 160V | 138.1°C | 116.8°C | 93.3°C |

| | PART (THICKNESS) DISTANCE, VOLTAGE | A (1.80mm) | B (3.45mm) | C (7.25mm) |
|---|---|---|---|---|
| CRS-4.00 | 30mm, 100V | 76.3°C | 115.7°C | 116.4°C |
| | 40mm, 125V | 106.6°C | 108.4°C | 117.4°C |
| | 50mm, 125V | 121.1°C | 105.4°C | 105.6°C |
| | 60mm, 150V | 137.2°C | 109.9°C | 99.3°C |
| | 70mm, 160V | 142.2°C | 110.0°C | 90.4°C |

DYEING METHOD AND APPARATUS FOR DYEING RESIN BODY BY VAPORIZATION AND DEPOSITION

TECHNICAL FIELD

The present disclosure relates to a dyeing device that performs dyeing by heating a resin body to which a dye is adhered to fix the dye onto the resin body.

BACKGROUND ART

In the related art, there is a known technique of performing dyeing on a resin body by heating the resin body to which a dye is adhered. In a method of dyeing a plastic lens disclosed in Patent Document 1, for example, a base on the surface of which a sublimation dye is applied faces the plastic lens in a vacuum atmosphere without contact. Next, by performing heating with a heating device, the sublimation dye sublimates and a dye layer is formed on the surface of the plastic lens.

In addition, a technique is known of fixing a dye by heating a resin body by irradiating a resin body with infrared light to which a dye is adhered. For example, a dyeing device disclosed in Patent Document 2 irradiates a plastic lens with infrared light in a state where an area of the plastic lens on which a dye is not vaporized and deposited is shaded by shading means. As a result, in a part where the dye is not vaporized and deposited, generation of yellowing due to heating is suppressed.

RELATED ART DOCUMENT

Patent Document

Patent Document 1: JP-A-1-277814
Patent Document 2: Japanese Patent No. 4802138

SUMMARY OF THE INVENTION

Problem that the Invention is to Solve

One aspect of the related art will be mentioned. For example, in the case where the technique described in Patent Document 1 is used, even when a dye is adhered on the surface of a resin body, the adhered dye is likely to sublimate again, since heating for fixing is performed in a vacuum atmosphere. Therefore, it has not been possible to perform stable dyeing with the dyeing device in Patent Document 1.

The other aspect of the related art will be mentioned. For example, if a resin body is heated by being irradiated with electromagnetic wave such as infrared light, there is a case where it is not possible to appropriately control the temperature increase of each part of the resin body due to an influence from the shape of the resin body or the like. For example, in order to uniformly heat a substantially plate-shaped resin body, a case is assumed where electromagnetic wave is uniformly applied on the surface of the resin body. In this case, if the thickness of the resin body is not constant, since it is more difficult for the temperature of the thick part to rise than for the temperature of the thin part, a temperature difference is caused between each part of the resin body. That is, it has been difficult in the related art to appropriately control the temperature rise of each part of a resin body while irradiating the resin body with electromagnetic wave to fix a dye by heating.

An object of the present disclosure is to provide a dyeing device capable of performing preferable dyeing.

Means for Solving the Problem

According to an aspect of the present disclosure, there is provided a dyeing device that dyes a resin body by vaporizing and depositing a sublimation dye adhered to a dyeing base to the resin body provided in an installing unit and fixing the dye to the resin body, including: a closed chamber that closes at least the periphery of the resin body provided in the installing unit; pressure lowering means for lowering the pressure inside the closed chamber; dye heating means for heating the dye adhered to the dyeing base; resin body heating means for heating the resin body by electromagnetic wave; and controlling means for controlling the operation of the dyeing device, in which the controlling means includes pressure lowering controlling means for lowering the pressure inside the closed chamber by using the pressure lowering means, vaporization controlling means for vaporizing and depositing the dye on the resin body by heating the dye adhered to the dyeing base inside the closed chamber of which pressure is lowered by the pressure lowering controlling means by the dye heating means to sublimate the dye in a state where the adhesion surface of the dyeing base to which the dye is adhered faces the resin body without contact, and fixation controlling means for fixing the dye by irradiating the resin body on which the dye is vaporized and deposited with electromagnetic wave from the resin body heating means to heat the resin body in a state where the pressure of the periphery of the resin body rises higher than the pressure at the vaporizing and depositing time by the vaporization controlling means.

According to another aspect of the present disclosure, there is provided a dyeing device that fixes a dye adhered to the surface of the resin body on a resin body and dye to resin body by heating the resin body installed at an installing unit, comprising: electromagnetic wave generating means for generating a electromagnetic wave; and distribution adjusting means for adjusting a strength distribution of electromagnetic wave applied on the resin body from the electromagnetic wave generating means.

The dyeing device according to the present disclosure is capable of performing preferable dyeing.

MODE FOR CARRYING OUT THE INVENTION

Figure 1:
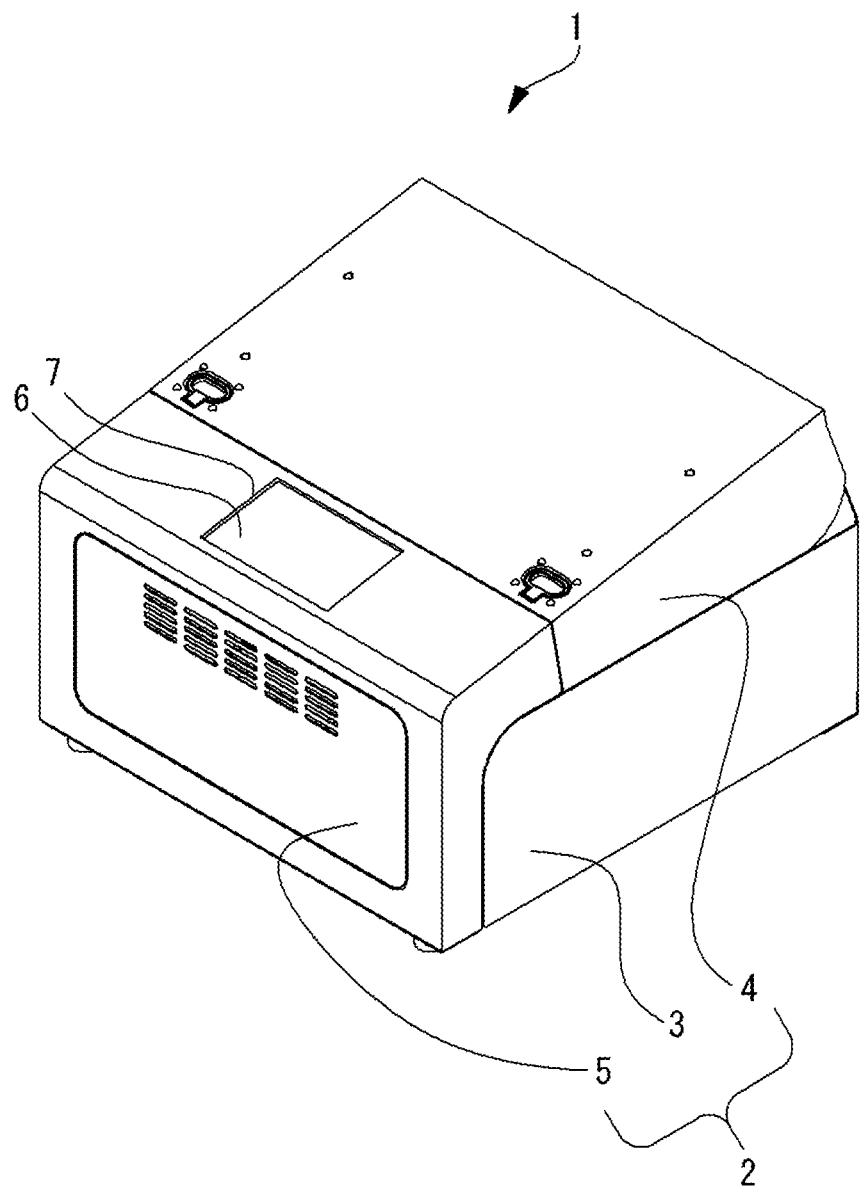
FIG. 1 is a perspective view of a dyeing device 1.

Hereinafter, an embodiment of the present disclosure will be described with reference to the drawings. First, with reference to FIG. 1 and FIG. 2, the outline configuration of the dyeing device 1 related to this embodiment will be described. In the following description, a diagonally downward left side, a diagonally upward right side, a diagonally upward left side, and a diagonally downward right side of FIG. 1 and FIG. 2 are respectively referred to as a front, a rear, a left side, and a right side of the dyeing device 1.

The dyeing device 1 includes a housing 2 in a substantially rectangular parallelepiped shape. The housing 2 houses various configurations for dyeing a resin body (in this embodiment, a plastic lens) inside. The housing 2 includes a base 3, an upper lid 4, and a front lid 5. The base 3 supports the entire body of the dyeing device 1. The upper lid 4 is supported so as to revolve in a vertical direction in the rear part of the base 3. By allowing the front part of the upper lid 4 to revolve upward, the upper side of the housing 2 is opened. The front lid 5 is plate-shaped and supported so as to revolve in a reciprocal direction at the lower end of the front side end portion of the base 3. By allowing the upper part of the front lid 5 to revolve in the front direction, the front side of the housing 2 is opened.

On the center of the upper surface of the base 3, a display 7 on the surface of which includes a touch panel 6 is provided. An operator can, by operating the touch panel 6, input various instructions to the dyeing device 1. On the rear surface of the upper lid 4, two cooling fans 8 (refer to FIG. 9) that cool the inside of the dyeing device 1 are provided side by side on the right and left.

Figure 2:
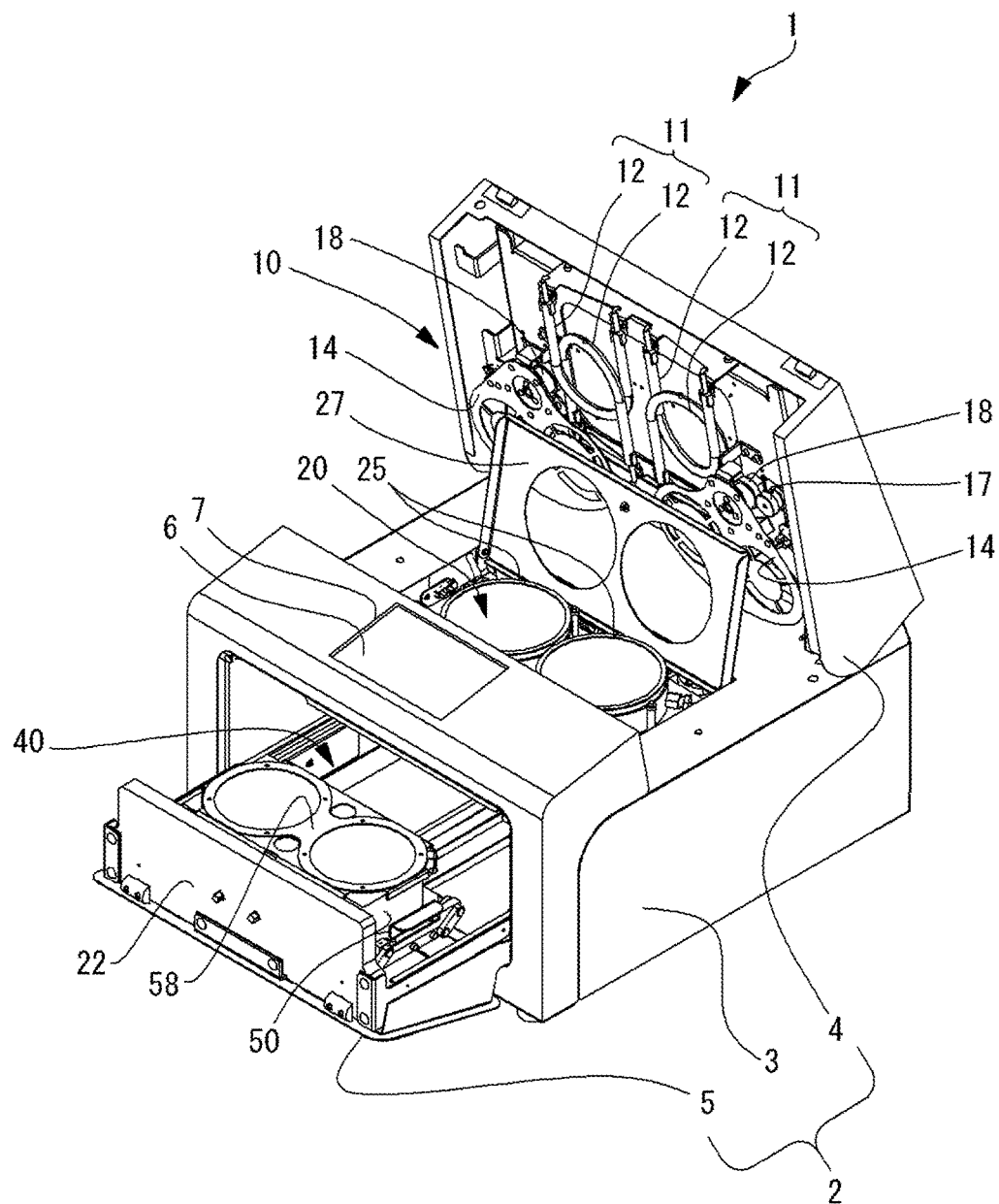
FIG. 2 is a perspective view of the dyeing device 1 in a state where an upper lid 4 and a front lid 5 are opened.

As illustrated in FIG. 2, in the inside of the housing 2, mainly, a heating unit 10, a closed chamber 20, an installing unit reciprocal movement mechanism 40, and an installing unit 50 are housed. The heating unit 10 is provided to heat a plastic lens and a sublimation dye adhered to a dyeing base 57 (refer to FIG. 7). The closed chamber 20 closes the periphery of a plastic lens installed at the installing unit 50 and forms a space in a substantially vacuum state in the inside. The installing unit reciprocal movement mechanism 40 moves the installing unit 50 reciprocally. In the installing unit 50, the plastic lens and the dyeing base 57 are installed. Hereinafter, each configuration will be described in detail with reference to FIG. 2 to FIG. 8.

The heating unit 10 will be described. As illustrated in FIG. 2, the heating unit 10 mainly includes an electromagnetic wave generating unit 11, a distribution adjusting unit 14, an adjusting unit rotating motor 80 (refer to FIG. 9), a motor gear 17, and an adjusting unit mounting gear 18.

The electromagnetic wave generating unit 11 will be described. The electromagnetic wave generating unit 11 according to this embodiment generates electromagnetic wave (in this case, infrared light) absorbed by the plastic lens and the dyeing base 57 (refer to FIG. 7). More specifically, an infrared light heater 12 that generates infrared light is used in the electromagnetic wave generating unit 11. However, it is also possible to use other configurations such as a halogen lamp or a far infrared radiation heater in the electromagnetic wave generating unit 11. In addition, a configuration that generates other electromagnetic wave such as an ultraviolet ray or a microwave may be used. The electromagnetic wave generating unit 11 is provided, so as to perform dyeing of two plastic lenses at the same time, in two units side by side on the right and left inside the upper lid 4 (that is, on the front side in the state where the upper lid 4 is opened). Furthermore, it is not necessary for the entire electromagnetic wave generated by the electromagnetic wave generating unit 11 to be absorbed by the plastic lens. In addition, it is needless to say that the number of the resin bodies dyed that can be used at the same time is not limited to two.

A generating part in which electromagnetic wave is generated in the electromagnetic wave generating unit 11 is formed in a circular shape corresponding to the shape of an opening 15 (refer to FIG. 3) provided in the distribution adjusting unit 14 which will be described later. In detail, the opening 15 according to this embodiment is formed to be in an annular shape, and the generating part of the electromagnetic wave is also formed in an annular shape. For example, in the case where the shape of the opening unit 15 is formed to be in a rectangular circular shape, it is preferable that the generating part of the electromagnetic wave is also formed in a rectangular circular shape. By allowing the shape of the generating part of the electromagnetic wave to correspond to the shape of the opening 15, compared to the case of adopting a generating part to other shapes such as a plate shape, a linear shape, or the like, the amount of electromagnetic wave blocked by the distribution adjusting unit 14 decreases. As a result, the electromagnetic wave is effectively applied on the plastic lens from the opening 15. In addition, "a corresponding circular shape" does not illustrate the case where the shape and the size of the generating part of the electromagnetic wave and the shape of the size of the opening 15 entirely coincide. That is, the shape of the generating part of the electromagnetic wave and the opening 15 may approximately coincide. Moreover, it is not required for the size of the electromagnetic wave and the opening 15 (for example, diameter) to necessarily coincide.

In the electromagnetic wave generating unit 11 according to this embodiment, by a plurality of infrared light heaters 12 being combined, the generating part in a circular shape is formed. More specifically, in order for an annulus to be formed by a U-shaped portion of each of two infrared light heaters 12 in a U-shape, two infrared light heaters 12 are arranged. An infrared light heater having a generating part in an annular shape is difficult to manufacture compared to an infrared light heater in other shapes including a U-shape, and requires a high cost. However, by combining a plurality of infrared light heaters 12, the generating part in a circular shape is easily formed with a low cost. In addition, it is needless to say that the number and the shape of the infrared light heaters 12 used in one electromagnetic wave generating unit 11 can be changed. Furthermore, in this embodiment, as illustrated in FIG. 2, two infrared light heaters 12 in a U-shape are arranged so as to intersect each other. In other words, a plane including an electromagnetic wave generating unit of one infrared light heater 12 and a plane including an electromagnetic wave generating unit of the other infrared light heater 12 intersect each other at an arranged position of two infrared light heaters 12. As a result, it is possible to control the unevenness in the intensity of the electromagnetic wave applied on the plastic lens. In addition, in the case where the generating part of the electromagnetic wave is formed in a circular shape, the generating part may not be in a continuous circular shape but in a discontinuous circular shape.

The distribution adjusting unit 14 will be described. As illustrated in FIG. 2, two distribution adjusting units 14 are provided side by side on the right and left so that the distribution adjusting units are positioned on the front side of each of two electromagnetic wave generating units 11 in a state where the upper lid 4 is opened. Therefore, if the upper lid 4 is closed, the distribution adjusting unit 14 is positioned at the lower side of the electromagnetic wave generating unit 11.

Figure 3:
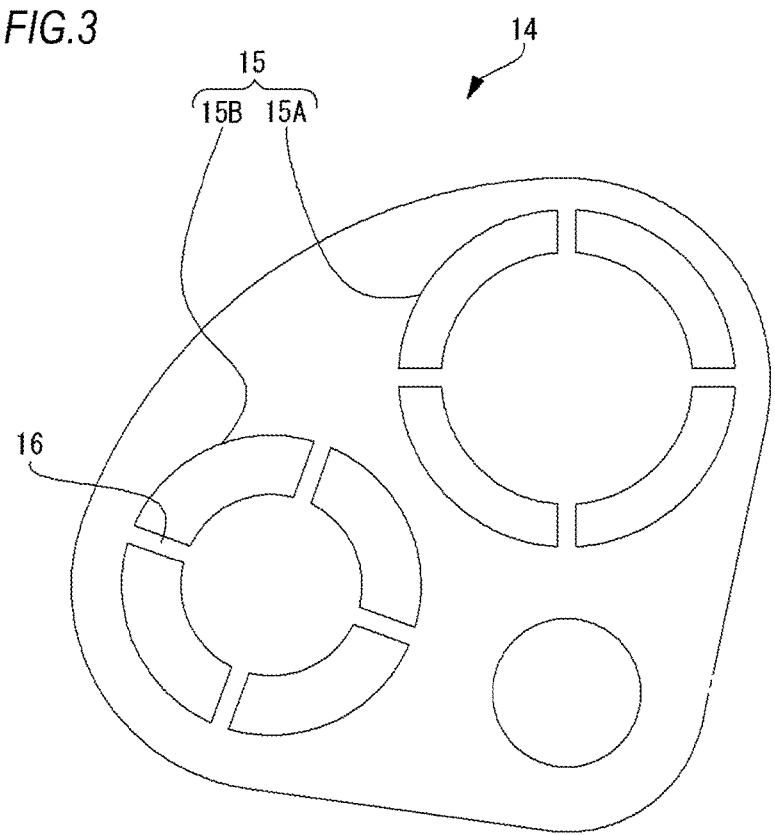
FIG. 3 is a plan view of a distribution adjusting unit 14.

As illustrated in FIG. 3, the distribution adjusting unit 14 is in a plate shape. In the distribution adjusting unit 14, the opening 15 allowed to pass through a part of the electromagnetic wave generated by the electromagnetic wave generating unit 11 is formed. The dyeing device 1 adjusts the strength distribution of the electromagnetic wave applied on the lower side from the electromagnetic wave generating unit 11 by the opening 15 of the distribution adjusting unit 14. In detail, the opening 15 is formed in a continuous circular shape. The dyeing device 1 is capable, by allowing electromagnetic wave through the opening 15 in a circular shape, of easily adjusting, with a simple configuration, the strength of the center part of the beam of the electromagnetic wave applied on the lower side and the strength of the periphery thereof. More specifically, the opening 15 according to this embodiment is in a shape where four supporting pieces 16 in a radial pattern for supporting a part in a disk shape on the inside are formed on the hole of a circular shape at constant intervals. However, in the case of forming the opening unit 15 in a circular shape, the opening unit 15 may be formed in a continuous circular shape. The opening 15 may be formed in a circular shape by arranging a plurality of holes in the circular shape. In addition, in this embodiment, in order to appropriately adjust the strength distribution of the electromagnetic wave applied on the plastic lens in a round shape, the shape of the opening 15 is formed in a round shape. However, the shape of the opening 15 may be appropriately changed according to the shape of the resin body to be dyed. Therefore, it is also possible to use an opening in other shapes such as a polygonal circular shape, an elliptical circular shape, or the like.

In each of the two distribution adjusting units 14, a plurality of openings 15 at least one of which is different from the other in size and shape (in this embodiment, two openings 15A and 15B) are formed. In this embodiment, the size (diameter) of an opening 15A is larger than the size of an opening 15B. The dyeing device 1 is capable, only by switching the openings 15A and 15B positioned between an object to be heated (for example, a plastic lens) and the electromagnetic wave generating unit 11, of easily switching the strength distribution of the electromagnetic wave applied on the object. In addition, it is needless to say that the number of the openings 15 formed in the distribution adjusting unit 14 is not limited.

As illustrated in FIG. 2, in the upper lid 4, two motor gears 17 rotated by an adjusting unit rotating motor 80 (refer to FIG. 9) are provided. The motor gears 17 are meshed with each of two adjusting unit mounting gears 18 and rotate the adjusting unit mounting gears 18. On the tip end side of each of the two adjusting unit mounting gears 18 (in the state in FIG. 2, the front side), the distribution adjusting unit 14 is mounted so as to be attached and detached. The dyeing device 1 switches, by driving the adjusting unit rotating motor 80 to rotate the distribution adjusting unit 14, the posture of the distribution adjusting unit 14. As a result, the openings 15A and 15B positioned between the object to be heated and the electromagnetic wave generating unit 11 is automatically switched without requiring an operation by the operator. In addition, the method of switching the openings 15A and 15B used can be changed. For example, by sliding the distribution adjusting unit 14 without rotation, the position of the distribution adjusting unit 14 may be changed and the openings 15A and 15B may be switched.

Figure 4:
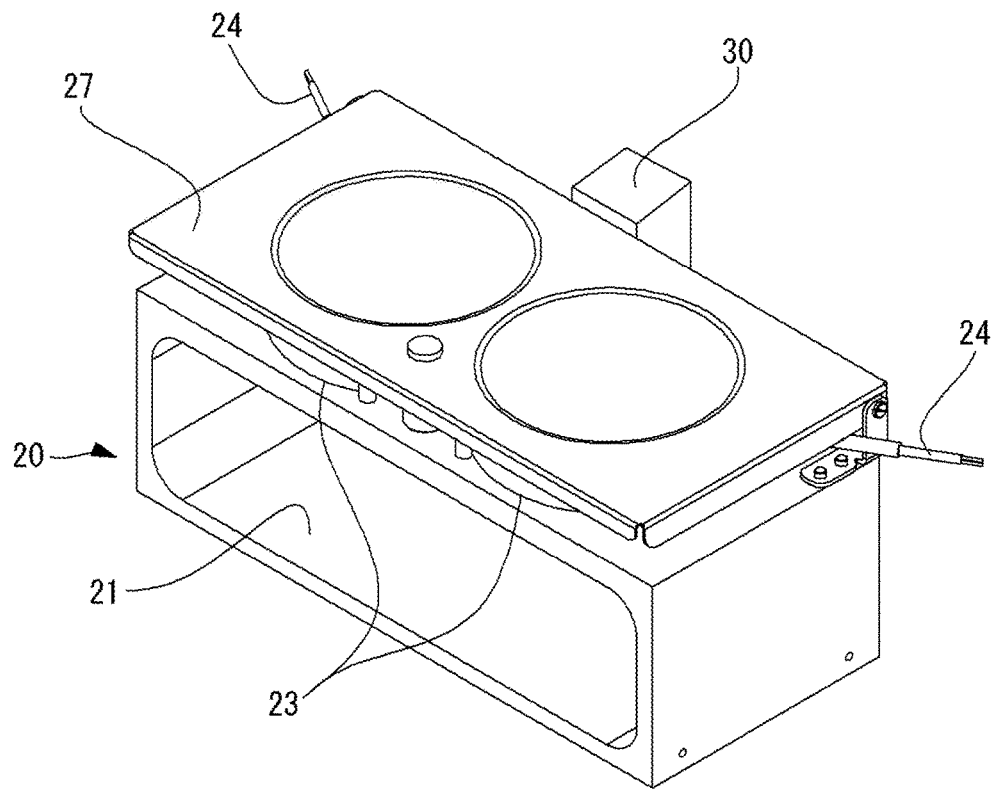
FIG. 4 is a perspective view of a closed chamber 20 and a configuration associated with the closed chamber 20.

The closed chamber 20 and a configuration associated with the closed chamber 20 will be described. As illustrated in FIG. 2, the closed chamber 20 is provided approximately on the center of the inside of the housing 2. If the upper lid 4 of the housing 2 is closed, the closed chamber 20 is positioned at the lower side of a heating unit 10. As illustrated in FIG. 4, the shape of the closed chamber 20 is a substantially rectangular box shape. The closed chamber 20 includes a closed chamber main body 21 and a closed chamber front wall 22 (refer to FIG. 2 and FIG. 7). The closed chamber main body 21 is in a substantially box shape of which the front side is opened. The closed chamber front wall 22 is capable of closing the opened part on the front side of the closed chamber main body 21.

As illustrated in FIG. 4, on the front wall of the closed chamber main body 21, two electromagnetic wave passing units 23 in a cylindrical shape are provided side by side on the right and left. The electromagnetic wave generated by the electromagnetic wave generating unit 11 (refer to FIG. 2) reaches the inside of the closed chamber 20 by passing through a space inside the electromagnetic wave passing unit 23. In each of the two electromagnetic wave passing units 23, a thermocouple 24 that detects the atmospheric temperature of the inside of the closed chamber 20 is provided.

As illustrated in FIG. 2, in each upper end edge in the two electromagnetic wave passing units 23, a transmitting unit 25 in a disk shape of which diameter is longer than the inner diameter of the electromagnetic wave passing unit 23 is provided so as to block the upper opening of the electromagnetic wave passing unit 23. The transmitting unit 25 may be formed from a material that allows at least a part of the electromagnetic wave generated by the electromagnetic wave generating unit 11 to penetrate. Moreover, it is preferable that the material of the transmitting unit 25 has heat resistance to withstand a temperature rise due to the electromagnetic wave. In this embodiment, as the material of the transmitting unit 25, heat-resistant glass that allows infrared light to penetrate is used. However, this is merely an example, and it is possible to change the material of the transmitting unit 25. The closed chamber 20 closes the space inside by the closed chamber main body 21, the closed chamber front wall 22, the electromagnetic wave passing unit 23, and the transmitting unit 25. If the transmitting unit 25 is provided at a part between the inside of the closed chamber 20 and the electromagnetic wave generating unit 11, even if the electromagnetic wave generating unit 11 is provided on the outside of the closed chamber 20, the electromagnetic wave is applied on the inside of the closed chamber 20. Therefore, the electromagnetic wave generating unit 11 is not affected by the change of pressure in the inside of the closed chamber 20.

As illustrated in FIG. 2 and FIG. 4, on the upper side of the closed chamber 20, a holding plate 27 for holding the position of the transmitting unit 25 is provided. The holding plate 27 is a plate-shaped member of which external form is in a rectangular shape, and includes two openings side by side on the right and left of which diameter is shorter than the diameter of the transmitting unit 25 in a disk shape. The rear end portion of the holding plate 27 is mounted so as to revolve with respect to the housing 2. If the holding plate 27 revolves in the upper direction, it becomes possible to provide and remove the transmitting unit 25 with respect to the electromagnetic wave passing unit 23 (refer to FIG. 2). If the holding plate 27 revolves in the front direction, the transmitting unit 25 is pressed from the upper direction by the holding plate 27 and the position of the transmitting unit 25 with respect to the electromagnetic wave passing unit 23 is held. In addition, as described hereinafter in detail, in a step of vaporizing and depositing a dye on a plastic lens, the inside of the closed chamber 20 becomes a substantially vacuum state. In this case, by the inside of the closed chamber 20 being decompressed, the position of the transmitting unit 25 is firmly fixed. Therefore, the holding plate 27 does not need to decompress the transmitting unit 25 with strong force.

As illustrated in FIG. 4, on the rear side of the closed chamber main body 21, a pressure controlling unit 30 is provided. Between the pressure controlling unit 30 and the rear of the closed chamber main body 21, an air supply and exhaust pipe (not illustrated) is connected. The pressure controlling unit 30 includes a pump 31 and an electromagnetic valve 33 (refer to FIG. 9). The dyeing device 1 is capable, by driving the pump 31, of discharging gas in the closed chamber 20 from the air supply and exhaust pipe towards the outside and lowering the pressure inside the closed chamber 20. In addition, the dyeing device 1 maintains, by closing the electromagnetic valve 33, seal performance of the inside of the closed chamber 20. Moreover, the dyeing device 1 is capable, by opening the electromagnetic valve 33, of introducing gas into the inside of the closed chamber 20 in a decompressed state from the outside and raising the pressure inside the closed chamber 20. Furthermore, in the closed chamber 20 (in this embodiment, the rear surface of the closed chamber main body 21), a pressure sensor 84 that detects the pressure inside the closed chamber 20 (refer to FIG. 9) is provided.

An installing unit reciprocal movement mechanism 40 will be described. As described above, the installing unit reciprocal movement mechanism 40 moves the installing unit 50 (refer to FIG. 2 and FIG. 6) in the reciprocal direction. The installing unit 50 becomes settled, if moved in the rear direction by the installing unit reciprocal movement mechanism 40, inside the closed chamber 20. The installing unit 50 is positioned, if moved reciprocally, on the outside of the closed chamber 20 and the housing 2 (refer to FIG. 2).

Figure 5:
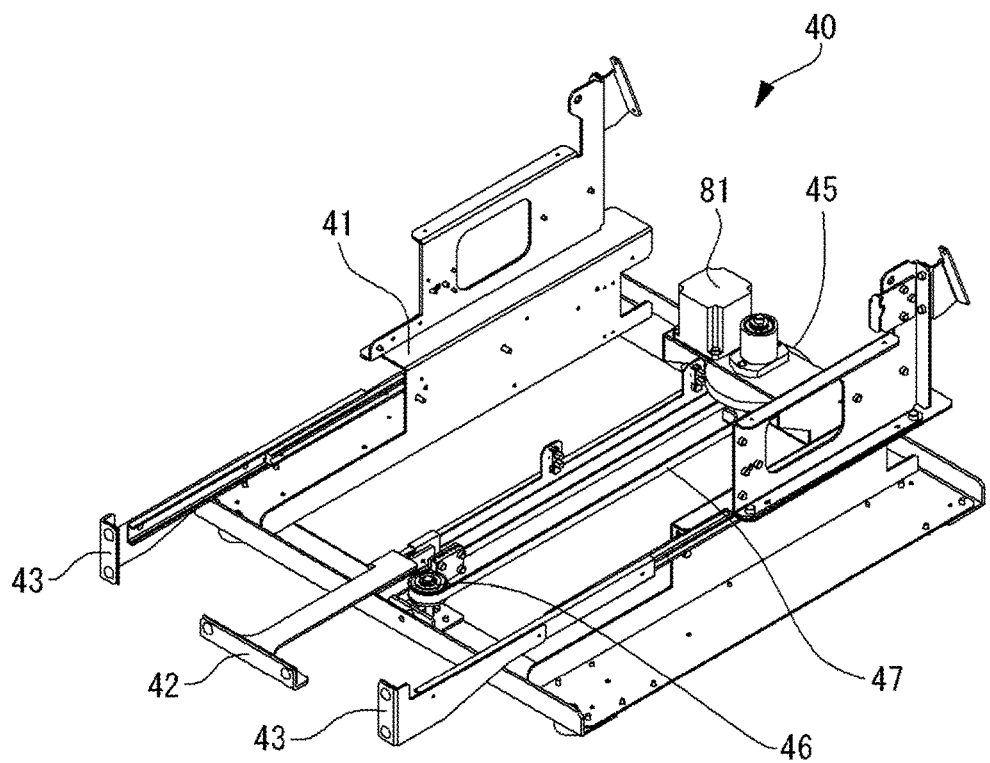
FIG. 5 is a perspective view of an installing unit reciprocal movement mechanism 40.

As illustrated in FIG. 5, the installing unit reciprocal movement mechanism 40 includes a main frame 41, a center frame 42, two side frames 43, a reciprocally moving motor 81, a driving pulley 45, a driven pulley 46, and a belt 47. The main frame 41 is arranged on the bottom part of the housing 2 (refer to FIG. 2) and supports the entire body of the installing unit reciprocal movement mechanism 40. The center frame 42 is formed in a T-shape when seen from a planar view and arranged on the center of the right and left direction of the installing unit reciprocal movement mechanism 40. The front side end portion of the center frame 42 is fixed to the bottom surface of at least one of the installing unit 50 and the closed chamber front wall 22 (refer to FIG. 7). In addition, in this embodiment, the installing unit 50 is mounted on the closed chamber front wall 22. The two side frames 43 are members in a substantially rod shape extending in the reciprocal direction and mounted respectively on the right and left of the center frame 42. The side frames 43 are guided, on the right and left of the main frame 41, by the movement in a reciprocal direction. The front side (tip end side) of the side frames 43 is fixed respectively on the right and left of the closed chamber front wall 22.

The reciprocally moving motor 81 is provided at the rear end portion of the main frame 41 and generates a driving force for reciprocally moving the installing unit 50. The driving pulley 45 is held so as to rotate on the center of the right and left direction in the rear end portion of the main frame 41 and rotates by the driving force of the reciprocally moving motor 81. The driven pulley 46 is held so as to rotate on the center of the right and left direction in the front end portion of the main frame 41. Both the rotation axis of the driving pulley 45 and the rotation axis of the driven pulley 46 extend in the vertical direction. The belt 47 is bridged over the driving pulley 45 and the driven pulley 46. The rear end portion of the center frame 42 is fixed to the belt 47.

If the reciprocally moving motor 81 rotates, the driving pulley 45 rotates. Accompanied with this, the belt 47 bridged over the driving pulley 45 rotates. If the belt 47 rotates, the center frame 42 fixed to the belt 47 moves reciprocally. As a result, the installing unit 50 fixed to the center frame 42 moves reciprocally. The reciprocal movement of the installing unit 50 is guided by the side frame 43 and the main frame 41.

Figure 6:
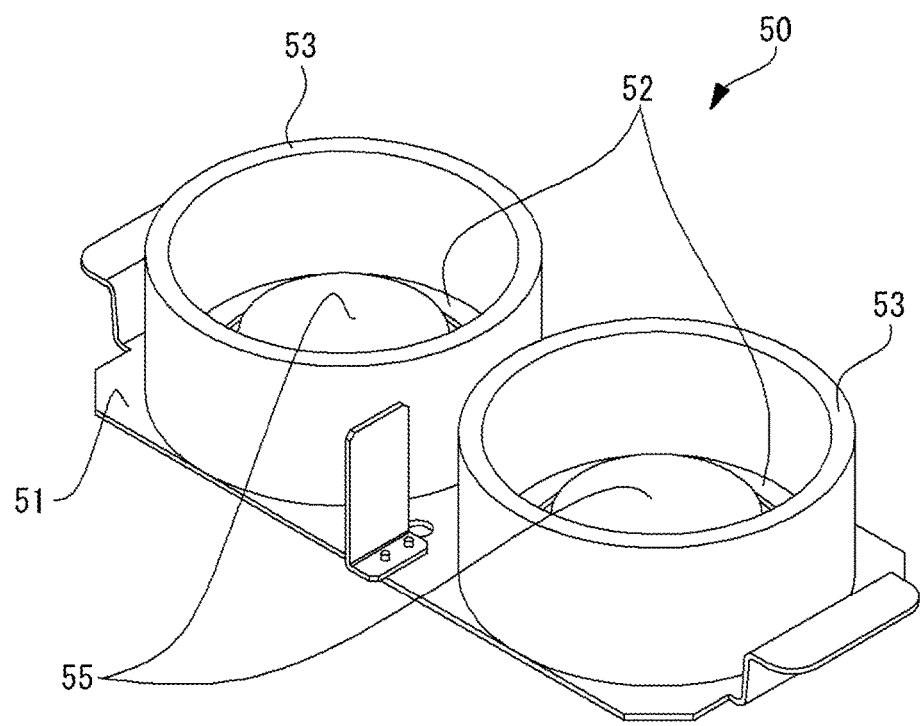
FIG. 6 is a perspective view of an installing unit 50.

The installing unit 50 will be described. As described above, in the installing unit 50, the plastic lens and the dyeing base 57 are provided. As illustrated in FIG. 6, the installing unit 50 includes a supporting plate 51 and two cylindrical units 53. The supporting plate 51 is a plate-shaped member in a substantially rectangular shape when seen from a planar view. The inner diameter of the cylindrical unit 53 is formed to be slightly longer than the diameter of the plastic lens to be dyed. The two cylindrical units 53 are provided side by side on the right and left on the upper surface of the supporting plate 51. On the upper surface of the supporting plate 51, the part surrounded by each of the two cylindrical units 53 (that is, the bottom wall part of the cylindrical units 53) is an attachment body mounting unit 52.

On the center part of the attachment body mounting unit 52, an attachment body 55 with adhesiveness with respect to the resin body (in this embodiment, the plastic lens) is mounted. The plastic lens is placed (provided) on the upper surface of the attachment body 55 and heated in a state in which the attachment body 55 is adhered. Therefore, even in the case where the temperature of a part of the plastic lens is higher than the temperature of other parts of the plastic lens, since heat is diffused to the attachment body 55, the temperature difference between each part of the plastic lens decreases. In addition, the attachment body mounting unit 52 is mounted so as to attach and detach the attachment body 55. Therefore, the operator is able, in a case where contamination, damage, or the like occurs to the attachment body 55, a case where it is desired to change the attachment body 55 to other attachment body 55 of which the shape or the like is different, or the like, to easily exchange the attachment body 55.

As for the material of the attachment body 55, it is preferable to use a material of which the thermal conductivity is equal to or higher than the thermal conductivity of the plastic lens. In this case, the heat of the part of which the temperature became higher than the temperature of other parts in the plastic lens is effectively diffused to the attachment body 55. As a result, the temperature difference between each part of the plastic lens greatly decreases. However, the thermal conductivity of the attachment body 55 may be the same as the thermal conductivity of the plastic lens. Even if the thermal conductivity of the attachment body 55 is lower than the thermal conductivity of the plastic lens, the temperature difference decreases compared to the case where the attachment body 55 is not used. In addition, it is preferable that the hardness of the attachment body 55 is from three to 30 degrees. The attachment body 55 with the hardness less than three degrees is difficult to manufacture, and also, even if the attachment body 55 can be manufactured, the attachment body 55 is so soft that it is difficult to maintain the form of the attachment body 55. In addition, if the hardness is higher than 30 degrees, it becomes difficult to adhere the attachment body 55 in accordance with the curvature of various plastic lenses. With the hardness being from three to 30 degrees, since the attachment body 55 is easily adhered to the plastic lens, the temperature difference decreases more effectively. The range of more preferable hardness of the attachment body 55 is from five to 10 degrees. In this embodiment, the resin body 55 is formed by silicon with the hardness of six degrees.

In the attachment body 55, it is preferable that the thickness of at least the part on which the plastic lens is mounted (in this embodiment, the entire attachment body) is from 1 mm to 10 mm. If the thickness is less than 1 mm, it becomes difficult to diffuse the heat of the plastic lens to the attachment body 55, and thus it is difficult to suppress the generation of the temperature difference. In addition, in the case where the thickness is more than 10 mm, it is difficult to adhere the attachment body 55 in accordance with the curvature of the plastic lens. With the thickness being from 1 mm to 10 mm, since the attachment body 55 is easily adhered to the plastic lens, the temperature difference is suppressed more effectively.

In addition, in the case where the surface of the plastic lens on the side on which the attachment body 55 is mounted is bent in a spherical-surface shape, in the attachment body 55, it is preferable that the curvature radius of a mounting surface on which the plastic lens is mounted (upper surface) is from 50 mm to 200 mm. In this case, the attachment body 55 is easily adhered to the plastic lens of which the curvature radius is long as well as to the plastic lens of which the curvature radius is short. That is, in this case, a sufficient contact area between the attachment body 55 and the plastic lens is secured, and thus the generation of the temperature difference is suppressed more effectively.

In addition, when seen from a planar view, it is preferable that the size of the attachment body 55 is a size larger than the size of the resin body to be heated. In this case, in the case of heating any of a resin body of which the temperature can more easily rise on the outer periphery than on the inside (for example, a plus lens or a convex lens) and a resin body of which the temperature can more easily rise on the inside than on the outer periphery (for example, a minus lens or a concave lens), the attachment body 55 is adhered to the entire resin body. Accordingly, the generation of the temperature difference can be suppressed regardless of the shape of the resin body. On the other hand, if the attachment body 55 is too large compared to the resin body when seen from a planar view, a stain from the dye can be easily adhered to the attachment body 55. Therefore, it is preferable that the size of the attachment body 55 is the same as the size of the resin body to be heated. However, the size of the attachment body 55 can be changed. For example, in the case where the dyeing device 1 only heats a minus lens, even if the attachment body 55 is allowed to be smaller than the minus lens and is adhered to the center part of the minus lens, the generation of the temperature difference can be sufficiently suppressed.

Figure 7:
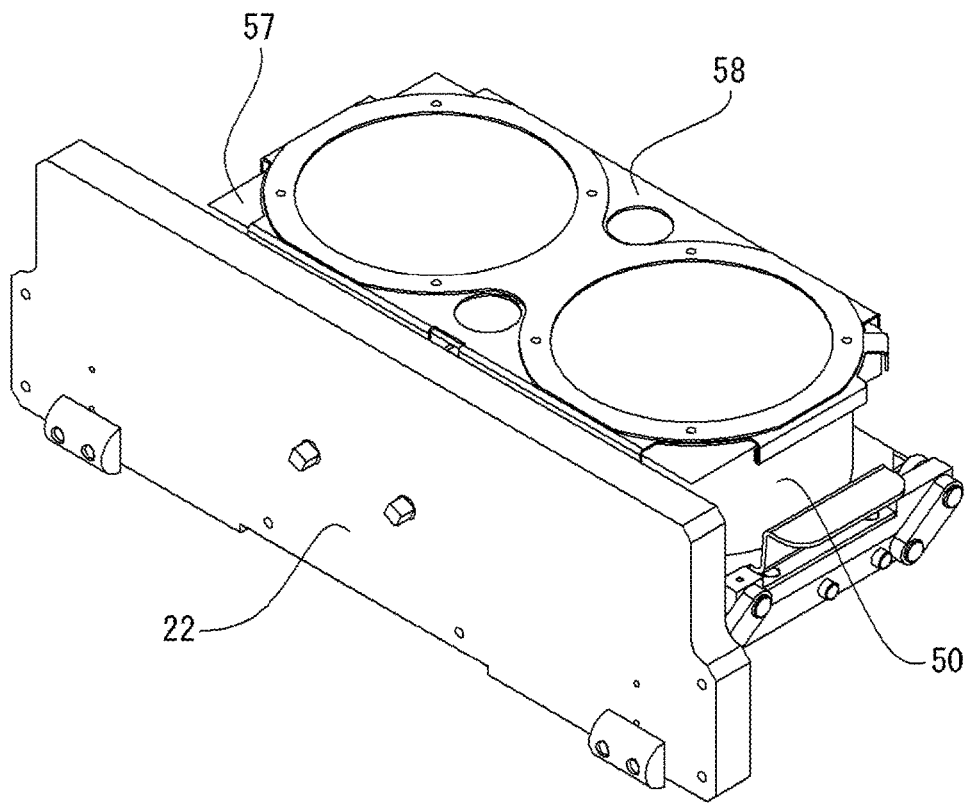
FIG. 7 is a perspective view of the installing unit 50 in the state where a dyeing base 57 is installed.

As illustrated in FIG. 7, at the front side of the installing unit 50, the closed chamber front wall 22 is fixed. In addition, in a step of vaporizing and depositing a dye on a plastic lens, a base holding frame 58 that holds the dyeing base 57 is mounted (provided) on the upper part of the cylindrical unit 53. In this embodiment, in the dyeing base 57, a piece of paper in a rectangular shape with moderate hardness is used. However, as for the material of the dyeing base 57, other materials such as a glass plate, a heat-resistant resin, a ceramic, a metal film, or the like may be used. It is preferable to apply a material that has heat resistance and does not provoke a chemical reaction with a dye as the material of the dyeing base 57. On the lower side surface of the dyeing base 57 (that is, the surface on the side facing the plastic lens), in accordance with the appearance of the dye to be targeted, ink in which a dye is subjected to dissolution or fine particle dispersion (material for dyeing) is printed by a printer. Print data (color data) for driving the printer is created, so as to dye on a spot desired by the operator in a color and density desired by the operator, by a personal computer (PC) that is an electronic computer. Therefore, in the dyeing base 57, a sublimation dye at an appropriate position in an appropriate amount is accurately adhered. If the print data is preserved, it is easy to perform the dyeing in the same manner a plurality of times. Compared to other dyeing methods such as dip dyeing or the like, it is easy to perform complex dyeing such as gradation. The color of the dye adhered to the dyeing base 57 may be one color or a plurality of colors.

The base holding frame 58 is a plate-shaped member of which the external form is in a substantially rectangular shape when seen from a planar view and holds the dyeing base 57. In the base holding frame 58, corresponding to the position and size of the cylindrical unit 53 of the installing unit 50 (refer to FIG. 6), two openings in a round shape are formed side by side on the right and left. At the position where the opening is formed, electromagnetic wave is directly applied on the dyeing base 57, without being blocked by the base holding frame 58. In addition, the dye sublimated from the dyeing base 57 smoothly flows towards the plastic lens side on the lower part. Moreover, in this embodiment, the base holding frame 58 is formed by a magnetic substance (for example, iron). If the base holding frame 58 is provided on the upper end portion of the cylindrical unit 53, the side on the lower part of the dyeing base 57 faces the plastic lens provided above the attachment body 55 without contact.

Figure 8:
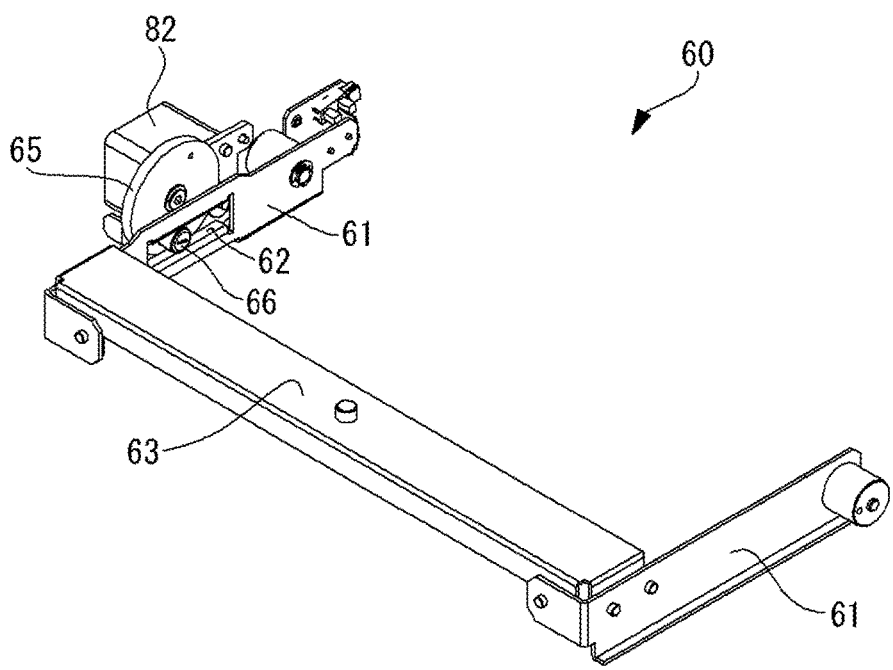
FIG. 8 is a perspective view of a retracting mechanism 60.

With reference to FIG. 8, a retracting mechanism 60 will be described. The retracting mechanism 60 retracts the dyeing base 57 held by the base holding frame 58 (refer to FIG. 7) from the installing unit 50. The retracting mechanism 60 mainly includes two supporting arms 61, an operating arm 63, a retracting motor 82, and a rotating link 65. The two supporting arms 61 extend in parallel in the reciprocal direction. The rear end side of each of the supporting arms 61 is held so as to rotate to the housing 2 (refer to FIG. 1 and FIG. 2). The operating arm 63 is a member in a substantially rod shape that extends in the horizontal direction. The left end portion of the operating arm 63 is fixed to the front end portion of the supporting arm 61 on the left side. The right end portion of the operating arm 63 is fixed to the front end portion of the supporting arm 61 on the right side. The operating arm 63 includes a magnet (not illustrated) at the bottom part. If the bottom part of the operating arm 63 comes into contact with the base holding frame 58, the base holding frame 58 sticks to the magnet of the operating arm 63.

The retracting motor 82 is provided on the left side of the retracting mechanism 60. The rotating link 65 is in the vicinity of the retracting motor 82 and is supported so as to rotate with the rotation axis extending in the horizontal direction as the center. The rotating link 65 is rotated by the power of the retracting motor 82. On the outside of a rotation axis on the right side surface of the rotating link 65, a protruding unit 66 in a cylindrical shape extending to the right is provided. In addition, in the supporting arm 61 on the left side, a long engaging hole 62 extending in the reciprocal direction is formed. The width (short diameter) of the long engaging hole 62 in the tip direction coincides with the diameter of the protruding unit 66. The protruding unit 66 is engaged with the long engaging hole 62.

The dyeing device 1 is capable, by driving the retracting motor 82 to rotate the rotating link 65, of rotating the supporting arm 61 on the left side centering on the rear end side. If the supporting arm 61 on the left side is rotated, the operating arm 63 and the supporting arm 61 on the right side are also rotated. The dyeing device 1 positions, until the heating of the dye of the dyeing base 57 (step of vaporizing and depositing) is completed, the operating arm 63 at the upper side compared to the base holding frame 58. If the step of vaporizing and depositing is completed, the dyeing device 1 moves, by the installing unit reciprocal movement mechanism 40 (refer to FIG. 5), the installing unit 50 (refer to FIG. 7) from the inside of the closed chamber main body 21 (refer to FIG. 4) towards the front side. The position of the operating arm 63 is lowered so that the base holding frame 58 is stuck to the magnet at the bottom part of the operating arm 63. Next, the position of the operating arm 63 is raised again. As a result, the dyeing base 57 held by the base holding frame 58 is automatically retracted from the installing unit 50 by the retracting mechanism 60.

Figure 9:
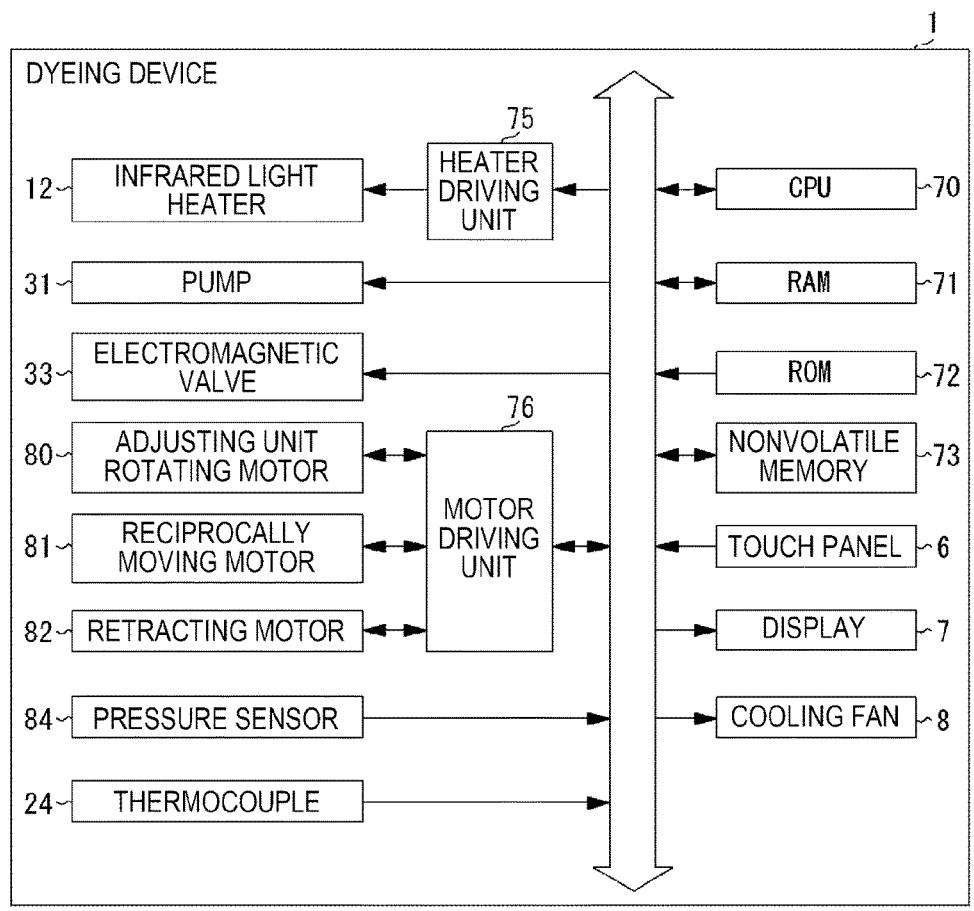
FIG. 9 is a block diagram illustrating the electric configuration of the dyeing device 1.

With reference to FIG. 9, the electric configuration of the dyeing device 1 will be described. The dyeing device 1 includes a CPU 70 which is in charge of the control of the dyeing device 1. In the CPU 70, a RAM 71, a ROM 72, a nonvolatile memory 73, a touch panel 6, a display 7, a cooling fan 8, a pump 31, an electromagnetic valve 33, a pressure sensor 84, a thermocouple 24, a heater driving unit 75, and a motor driving unit 76 are connected through a bus.

The RAM 71 temporarily stores various pieces of information. In the ROM 72, a control program for controlling the operation of the dyeing device 1 (for example, a dyeing control program for controlling a dyeing step illustrated in FIG. 11, or the like) is stored. The nonvolatile memory 73 is a storing medium capable of holding stored contents when power supply is cut (for example, hard-disk drive, flash ROM, or the like). The heater driving unit 75 is connected to two infrared light heaters 12 and controls driving of the infrared light heaters 12. The motor driving unit 76 controls driving of each of the adjusting unit rotating motor 80, the reciprocally moving motor 81, and the retracting motor 82.

The outline of a manufacturing method of a dyeing resin body related to this embodiment will be described. In the related art, as a method of manufacturing a dyeing resin body by dyeing a resin body, the dip-dyeing method (hereinafter referred to as dipping method) is frequently used. In the dipping method, the liquid to which a dye is dispersed is heated and a resin body is dipped into the heated liquid to perform dyeing. In this dipping method, various problems such as unstable dyeing due to condensation of the dye or the like, excessive dye waste, poor operating environment, and the like can occur. In addition, there is also a method of dyeing a resin body by sublimating a sublimation dye in a solid form by heating the dye. However, it is difficult to blow off the sublimation dye in a solid form in a quantitative way, and also difficult to adjust colors. In contrast, in the dyeing method related to this embodiment (hereinafter referred to as gas phase transcription dyeing method), the sublimation dye is adhered to the dyeing base 57 in a plate form and the dye is transcribed (vaporized and deposited) on the resin body from the dyeing base 57. Next, by the resin body being heated, the dye is fixed on the resin body. Therefore, scattering of hue and density decreases and the quality of the dye is stabilized. Since it is preferable that the amount of the dye required for dyeing (that is, a dye adhered to the dyeing base) is smaller than that of the dye dispersed to liquid according to the dipping method, the amount of the wasted dye is smaller than in the dipping method. In addition, the operating environment is improved compared to the case where the dipping method is performed. Moreover, "to be fixed" in this embodiment illustrates a state where the dye adhered to the resin surface is diffused inside the resin by heat on a monomolecular level. There is also a case where "to be fixed" illustrates dyeing or coloring. Furthermore, in a step of fixing, the dye transcribed to the resin body may be heated. Also in this embodiment, by the light in the visible range generated by the electromagnetic wave generating unit 11, the dye is heated along with the resin body and fixed to the resin body.

In the case where a resin body is dyed by the gas phase transcription dyeing method, the dye of the dyeing base 57 is heated by the step of vaporizing and depositing and the resin body is heated by the step of fixing. In the step of vaporizing and depositing, in order to protect the condensation or the like of the dye while accurately vaporizing and depositing the dye, it is required to heat the dye with the periphery of the resin body in a substantially vacuum state. In addition, in the step of fixing, if a temperature difference occurs in each part of the resin body, there is a case where the fixing of the dye becomes non-uniform. There is also a case where the effect of coloring generated on the resin body by heating is emerged non-uniformly, and thus the appearance does not look good. Therefore, in the gas phase transcription dyeing method in the related art, after the step of vaporizing and depositing by electromagnetic wave heating is performed in a substantially vacuum atmosphere, the resin body is moved to an oven and the step of fixing by the oven is performed. By using the oven, the temperature of the resin body rises slowly, and thus the generation of the temperature difference of each part of the resin body can be suppressed.

However, in the gas phase transcription dyeing method in the related art, a device for performing the step of vaporizing and depositing is used along with an oven for performing the step of fixing. In this case, a broad space for installing two devices is required, and it is difficult to lower the cost for introducing the device. Therefore, for example, it is difficult to perform the gas phase transcription dyeing method in a retail shop that sells glasses, and it is not possible to quickly provide a product to a customer. Moreover, in the case of performing the step of fixing by an oven, time for moving the resin body to the oven is required, and the speed of the temperature increase by the oven is also slow. Therefore, it is also difficult to decrease the time required for the step of fixing.

In order to solve the above problems, it is preferable to use the electromagnetic wave generating unit used in heating the dye in the step of vaporizing and depositing which is also used in heating the resin body in the step of fixing. However, in the case of irradiating the resin body with electromagnetic wave for heating, as described above, there is a case where the temperature difference occurs in each part of the resin body and the dyeing quality is lowered. In addition, if the step of fixing is performed with the pressure of the periphery of the resin body being low, there is a possibility that the dye adhered to the resin body is sublimated again and the dye quality is not stable. According to the technique exemplified in this embodiment, it is possible to solve the above problems and also to manufacture the high-quality dyeing resin body with a low cost in a short period of time.

Figure 10:
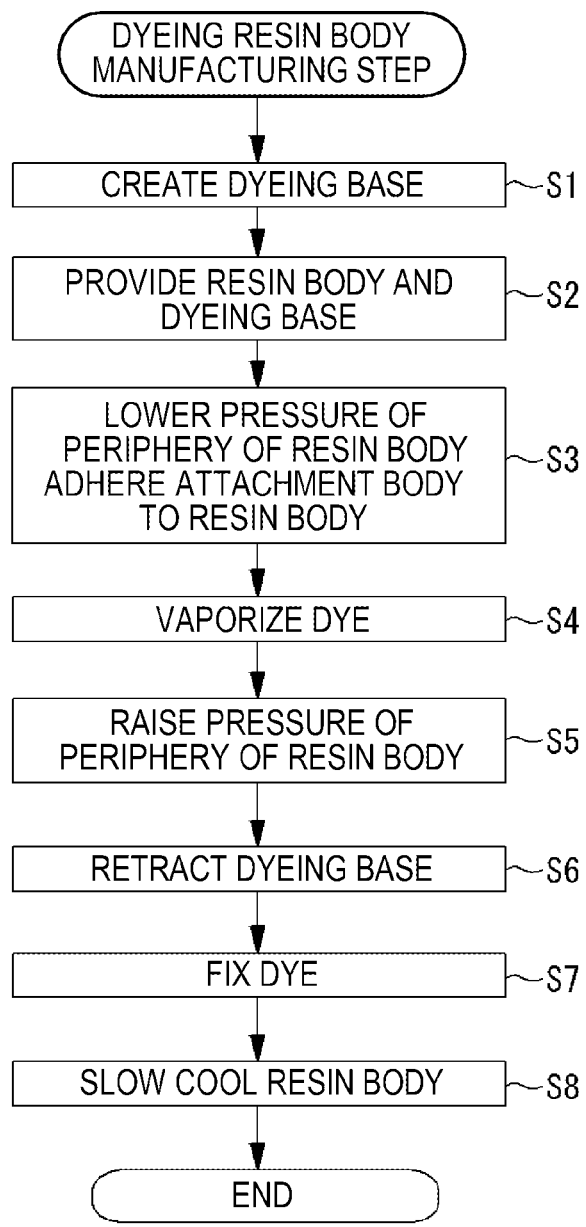
FIG. 10 is a flowchart for describing a manufacturing step of a resin body for dyeing according to an embodiment.

With reference to FIG. 10, the manufacturing step of the dyeing resin body related to this embodiment will be described in detail. First, a step of creating the dyeing base 57 is performed (S1). As described above, in this embodiment, the printer prints, based on the print data created by the PC, the ink containing the sublimation dye on the base (in this embodiment, a piece of paper). As a result, the dyeing base 57 is created. Therefore, in the dyeing base 57, a sublimation dye at an appropriate position in an appropriate amount is accurately adhered. Creating, revising, preserving, or the like of the print data in the PC can be easily done. Therefore, complex dyeing can be also easily done, and thus it is possible to repeat the same dyeing. However, even if the dyeing base 57 is created without using a PC or a printer, the present disclosure can be realized. For example, the operator may create the dyeing base 57 by adhering the sublimation dye on a piece of paper by using a spray or the like.

Next, the operator provides the resin body to dye and the dyeing base 57 created in S1 at the position where the dyeing is performed (S2). In this embodiment, the plastic lens, which is the resin body, is provided on the attachment body 55 of the installing unit 50 (refer to FIG. 6). The dyeing base 57 is provided, while being held in the base holding frame 58 (refer to FIG. 7) on the upper end of the cylindrical unit 53 of the installing unit 50. The dyeing base 57 is provided so that the adhesion surface on which the sublimation dye is adhered faces the resin body without contact. Therefore, in this embodiment, the dyeing base 57 is arranged so that the adhesion surface faces the lower side.

Next, a step of lowering the pressure of the periphery of the resin body and a step of adhering the attachment body 55 to the resin body are performed (S3). In this embodiment, by gas in the closed chamber 20 discharged to the outside by the pump 31 (refer to FIG. 9), the inside of the closed chamber 20 becomes to be in a substantially vacuum state. During this, gas that exists between the bottom surface of the resin body and the upper surface of the attachment body 55 is sucked and the attachment body 55 is adhered to the bottom surface of the resin body (that is, the surface opposite to the surface on which the dye is vaporized and deposited). Therefore, in this embodiment, even if a step of pushing the attachment body 55 against the resin body or the like is not performed, the attachment body 55 is adhered to the resin body in the step of forming a substantially vacuum space. There is also no case where the attachment body 55 adhered to the resin body becomes an obstacle to the vaporization and deposition (that is, adhesion of the dye to the surface of the resin body from the dyeing base 57).

Next, a step of vaporizing and depositing the sublimation dye on the resin body is performed (S4). In this embodiment, the dyeing base 57 is heated by the electromagnetic wave generated by the electromagnetic wave generating unit 11. As a result, the sublimation dye adhered to the side on the lower side of the dyeing base 57 is heated and sublimated to be vaporized and deposited on the upper surface of the resin body.

Next, a step of raising the pressure of the periphery of the resin body is performed (S5). In this embodiment, the electromagnetic valve 33 (refer to FIG. 9) is opened, and gas on the outside is introduced through a supply and exhaust pipe inside the closed chamber 20. As a result, the pressure inside the closed chamber 20 is returned until the pressure reaches a high value.

Next, a step of retracting the dyeing base 57 from the installing unit 50 is performed (S6). In this embodiment, first, the installing unit 50 is moved to the outside of the closed chamber 20 by the installing unit reciprocal movement mechanism 40 (refer to FIG. 5). The base holding frame 58 held by the dyeing base 57 is retracted from the installing unit 50 by the retracting mechanism 60 (refer to FIG. 8). After this, the installing unit 50 is returned to the inside of the closed chamber 20 by the installing unit reciprocal movement mechanism 40.

Next, a step of fixing the dye on the resin body is performed (S7). In this embodiment, the electromagnetic wave generating unit 11 in which the step (S4) of vaporizing and depositing is used is driven again. In order to retract the dyeing base 57, the electromagnetic wave applied on the resin body is generated by the electromagnetic wave generating unit 11 without being blocked by the dyeing base 57. Therefore, since the dyeing base 57 does not burn, the quality of the dye is not lowered by a cinder or the like. The irradiation distribution of the electromagnetic wave is appropriately adjusted by the distribution adjusting unit 14 (refer to FIG. 3). Moreover, the attachment body 55 is adhered to the resin body, and the heat locally generated at the part of the resin body is diffused to the attachment body 55. Therefore, the temperature difference in each part of the resin body hardly occurs. The electromagnetic wave irradiates the resin body, on the side opposite to the side on which the attachment body 55 is adhered (in this embodiment, the upper surface). Therefore, the electromagnetic wave reaches the resin body without passing the attachment body 55, and the dye vaporized and deposited on the upper surface of the resin body is effectively fixed.

Next, slow-cooling of the resin body is performed (S8), and the manufacturing step of the dyeing resin body is terminated. In this embodiment, inside the closed chamber 20 or in the space on the front side of the closed chamber 20 (front chamber), the resin body is allowed to stand by for more than a predetermined time. As a result, the temperature of the resin body is slowly lowered. The dyeing device 1 moves the resin body of which the temperature is lowered to the outside of the housing 2 and terminates the step. The dyeing device 1 is capable, by performing a step of slow-cooling (S8), of lowering the risk of the operator getting scalded. In addition, the possibility of a change and crack generated due to the rapid decrease of the temperature of the resin body is also lowered.

Figure 11:
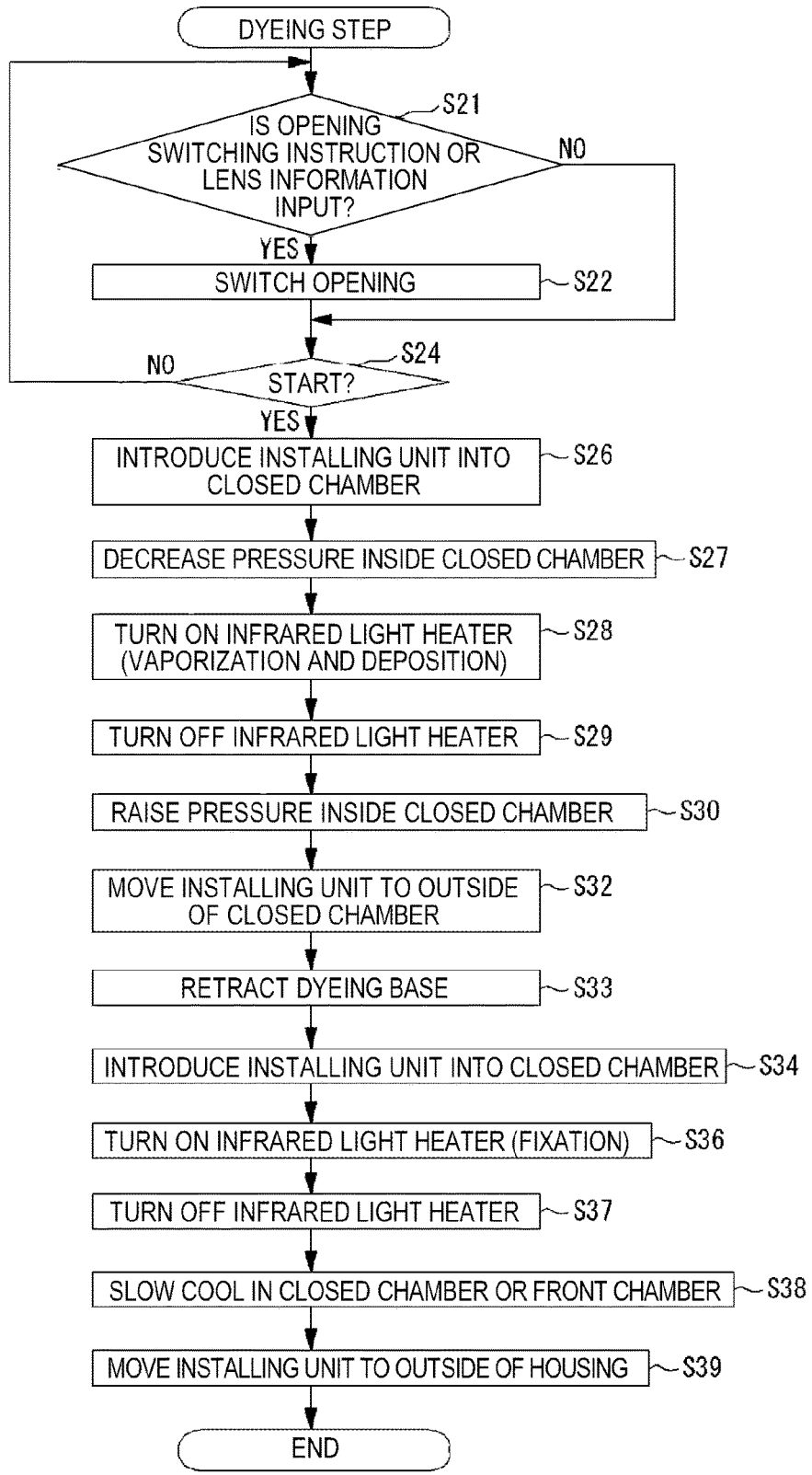
FIG. 11 is a flowchart of dyeing treatment performed by the dyeing device 1.

With reference to FIG. 11, a dyeing step performed by the CPU 70 of the dyeing device 1 will be described. As described above, in the ROM 72 of the dyeing device 1, a dyeing control program for controlling the dyeing step and the like are stored. The CPU 70 performs, as the power of the dyeing device 1 is turned on, according to the dyeing control program, the dyeing treatment illustrated in FIG. 11. In the dyeing treatment, the steps of S3 to S8 of the dyeing resin body manufacturing step described above (refer to FIG. 10) are automatically performed.

First, it is determined whether an opening conversion instruction and lens information are input (S21). The opening conversion instruction is an instruction for switching the positioned opening 15, among a plurality of the openings 15 formed in the distribution adjusting unit 14 (refer to FIG. 3), between the electromagnetic wave generating unit 11 and the installing unit 50 (refer to FIG. 1). The instruction for switching the opening 15 may be an instruction for directly designating the size of the opening 15. In addition, lens information is a parameter of the plastic lens to be dyed. The parameter is, for example, capable of using the material, diameter, frequency, refractive index, height of the upper end surface, height of the center surface, shape, or the like of the lens. The operator can input, by operating the touch panel 6, the opening conversion instruction and the lens information to the dyeing device 1. In addition, the dyeing device 1 is also capable of, through a network or the like, inputting the opening conversion instruction and the lens information from other devices.

If any one of the opening conversion instruction and the lens information is input (S21: NO), the step proceeds to the determination of S24 without change. If the opening conversion instruction is input (S21: YES), by the distribution adjusting unit 14 rotated by the adjusting unit rotating motor 80 (refer to FIG. 9), the opening 15 is switched (S22). In addition, if the lens information is input (S21: YES), so as for the opening 15, which is proper for heating the lens having the input parameter, to be used, the adjusting unit rotating motor 80 is driven. As one example, in this embodiment, as the lens information, the shape of the lens (plus lens, minus lens, or the like) is input. The CPU 70 switches the opening 15 in accordance with the input shape of the lens. The step proceeds to the determination of S24.

In this embodiment, in the case where an opening 15A of which the diameter is long is used, the strength distribution of the electromagnetic wave is stronger on the outside than on the center part of the plastic lens. In addition, in the case where an opening 15B of which the diameter is short, the electromagnetic wave that passes through the opening 15B in a circular shape overlaps with the center part of the plastic lens. As a result, the strength distribution of the electromagnetic wave is stronger on the center part than on the outside of the plastic lens. Therefore, in the case where a minus lens is designated as the plastic lens to be dyed, the CPU 70 positions the opening 15A of which the diameter is long between the electromagnetic wave generating unit 11 and the installing unit 50. In this case, each part of the minus lens of which the thickness is greater on the outside than on the center part is heated in a substantially uniform manner. Meanwhile, in the case where a plus lens is designated as the plastic lens to be dyed, the CPU 70 positions the opening 15B of which the diameter is short between the electromagnetic wave generating unit 11 and the installing unit 50. In this case, each part of the plus lens of which the thickness is greater on the center part than on the outside is heated in a substantially uniform manner.

Next, it is determined whether the instruction for starting the dyeing is input (S24). The operator provides the plastic lens and the dyeing base 57 in the installing unit 50. Next, the operator inputs a starting instruction for the dyeing to the dyeing device 1 on the touch panel 6, by touching a position in accordance with a start button (not illustrated) displayed on the display 7. In the case where the starting instruction for the dyeing is not yet input (S24: NO), the step returns to the determination of S21 and the determination of S21 ad S24 is repeated.

If the starting instruction for the dyeing is input (S24: YES), the reciprocally moving motor 81 (refer to FIG. 5) is driven, and, by the installing unit 50 moving reciprocally, the installing unit 50 is carried into the closed chamber 20 (S26). As a result, the inside of the closed chamber 20 is closed by the closed chamber main body 21, the closed chamber front wall 22, and the transmitting unit 25. Next, the gas in the closed chamber 20 is discharged to the outside by the pump 31 (refer to FIG. 9), and the pressure inside of the closed chamber 20 decreases to be in a substantially vacuum state (S27). As a result, the attachment body 55 is automatically adhered to the plastic lens.

If the pressure inside the closed chamber 20 detected by the pressure sensor 84 (refer to FIG. 9) is equal to or less than the threshold and it is determined that the discharge of the gas is completed, the infrared light heater 12 (refer to FIG. 2) is turned on and the electromagnetic wave (in this embodiment, infrared light) is generated (S28). The electromagnetic wave is applied towards the dyeing base 57 provided in the installing unit 50. As a result, the sublimation dye adhered to the surface on the lower side of the dyeing base 57 is heated and sublimated to be adhered (vaporized and deposited) on the surface on the upper side of the plastic lens. In the step of S28 according to this embodiment, the electromagnetic wave is applied from the infrared light heater 12 at the maximum output. As a result, stable vaporization and deposition can be performed in a short period of time. In addition, the irradiation time of the electromagnetic wave used for vaporization and deposition is set in advance. If the irradiation time is passed, the infrared light heater 12 is turned off (S29). The electromagnetic valve 33 (refer to FIG. 9) is opened, the gas from the outside is introduced into the closed chamber 20, and the pressure inside the closed chamber 20 is substantially increased to atmospheric pressure (S30).

Next, the reciprocally moving motor 81 is driven and the installing unit 50 is moved to the outside (front) of the closed chamber 20 (S32). After the retracting motor 82 (refer to FIG. 8) is driven and the base holding frame 58 is adsorbed to the operating arm 63 of the retracting mechanism 60 by magnetic force, the operating arm 63 is raised. As a result, from the position of being heated by the electromagnetic wave generating unit 11, the dyeing base 57 is retracted (S33). Therefore, the dyeing device 1 is capable of performing the dyeing without allowing the operator to perform an operation for retracting the dyeing base 57. After this, the installing unit 50 is again carried to the inside of the closed chamber 20 by the installing unit reciprocal movement mechanism 40 (S34).

Next, in a state where the pressure inside the closed chamber 20 is the same as atmospheric pressure or substantially the same as atmospheric pressure, the infrared light heater 12 is turned on, and the electromagnetic wave is generated (S36). In order for the dyeing base 57 to be retracted, the electromagnetic wave is directly applied on the plastic lens set on the attachment body 55 of the installing unit 50 and heats the plastic lens. As a result, the dye vaporized and deposited on the upper surface of the plastic lens is fixed. Since the pressure inside the closed chamber 20 is approximately atmospheric pressure, the possibility of the dye adhered to the plastic lens becoming unstable by being sublimated again is low. The strength distribution of the electromagnetic wave applied on the plastic lens is appropriately adjusted by the distribution adjusting unit 14. Therefore, the temperature rise of each part of the plastic lens is appropriately controlled (so as to be approximately uniform). In addition, on the lower side surface of the plastic lens, the attachment body 55 is adhered. Therefore, even in the case where the temperature of a part of the plastic lens is higher than the temperature of other parts, the heat generated in a greater amount than in the other parts is diffused on the attachment body 55. As a result, generation of the difference of the temperature rise ratio of each part of the resin body can be suppressed.

In the step of S36 according to this embodiment, first, the electromagnetic wave is applied from the infrared light heater 12 at the maximum output. Therefore, the dyeing device 1 is capable of raising the temperature of the plastic lens in a short period of time. Next, the CPU 70 adjusts, if the temperature rise of the plastic lens is completed, the output of the infrared light heater 12 so that the temperature of the plastic lens is maintained. The timing of adjusting the output may be a timing when the predetermined temperature is detected by the thermocouple 24 (refer to FIG. 4) or a timing when the predetermined time passes from the irradiation start time of the electromagnetic wave. The temperature of the sublimation dye used in this embodiment rises to 170° C. Meanwhile, in order to complete fixing in a short period of time, it is preferable to perform the step of fixing at a high as possible temperature. Therefore, it is preferable for the CPU 70 to control the infrared light heater 12 so that the temperature of the plastic lens is from 130° C. □ to 170° C. □. More preferably, the infrared light heater 12 is controlled so that the fixing is performed in the range of 140° C. to 160° C. As an example, in this embodiment, the infrared light heater 12 may be controlled so that the temperature detected by the thermocouple 24 becomes 150° C. In addition, the irradiation time of the electromagnetic wave used for fixing is set in advance. In addition, the dyeing device 1 may maintain the temperature of the plastic lens by switching the opening 15 during the step of fixing (S36). If the irradiation time is passed, the infrared light heater 12 is turned off (S37). The plastic lens is allowed to stand by inside the closed chamber 20 or the front chamber, and cooling of the plastic lens is performed (S38). If the slow-cooling is completed, the installing unit 50 is moved to the outside of the housing 2 by the installing unit reciprocal movement mechanism 40 (S39) and the step of dyeing is terminated. In addition, the cooling fan 8 is always driven when at least the electromagnetic wave is generated. Therefore, the heat wasted inside the housing 2 is discharged to the outside by the cooling fan 8.

In addition, in this embodiment, the step of fixing is performed in a state where the pressure of the periphery of the plastic lens (that is, the pressure inside the closed chamber 20) is atmospheric pressure. Therefore, the possibility that the dye vaporized and deposited on the upper surface of the plastic lens will be once again sublimated is lowered. However, the pressure of the periphery of the plastic lens at the fixing time is not limited to atmospheric pressure. For example, the pressure of the periphery of the plastic lens may be pressure higher than atmospheric pressure. In addition, the pressure of the periphery of the plastic lens may be set between the pressure at the vaporizing and depositing time and atmospheric pressure. That is, the dyeing device 1 is capable of, if the pressure at the fixing time is at least higher than the pressure at the vaporizing and depositing time, compared to the case where the step of fixing is performed at the same pressure as the pressure at the vaporizing and depositing time, lowering the ratio of the dye sublimated again.

With reference to the FIG. 12, a first modification of the above embodiment will be described. In the dyeing device 1 according to the above embodiment, in the case where the openings 15A and 15B are switched by the distribution adjusting unit 14 rotating, or in the case where the distribution adjusting unit 14 is switched, the irradiation distribution of the electromagnetic wave changes. Meanwhile, in the first modification example illustrated in FIG. 12, by a distance D between a distribution adjusting unit 14 and a plastic lens 88 provided in an installing unit 50 adjusted, the irradiation distribution of the electromagnetic wave changes.

Figures 12, 13:
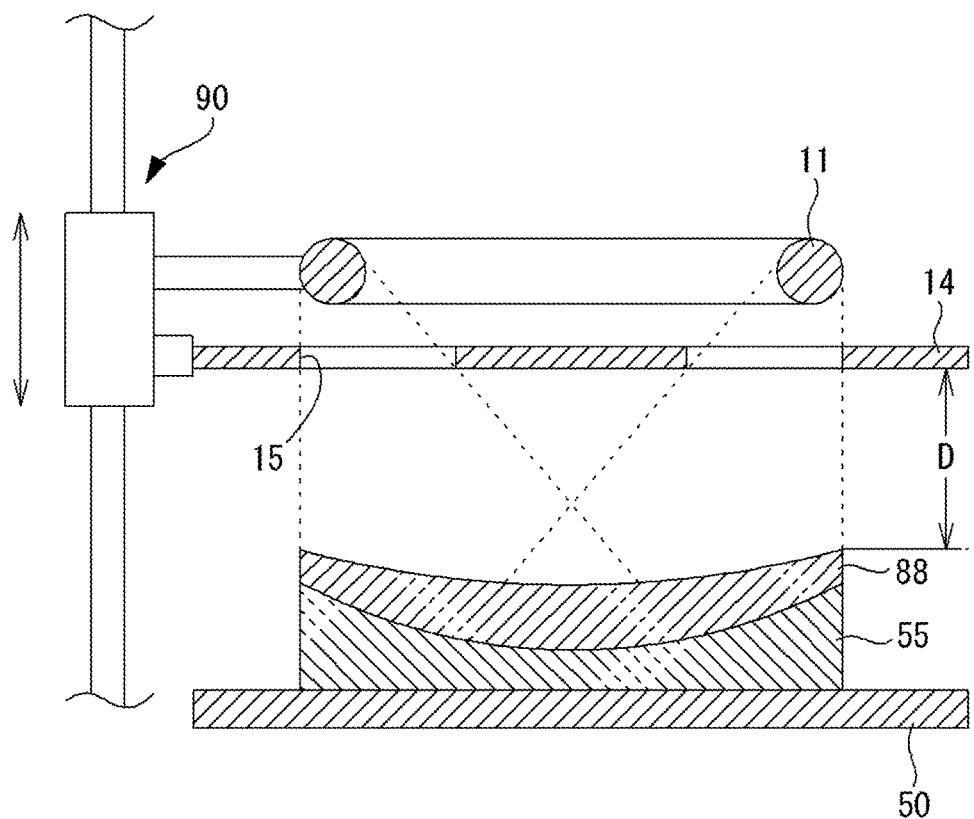
FIG. 12 is a view for illustrating a distance adjusting unit 90 included in the dyeing device 1 according to a first modification example.
FIG. 13 is a view illustrating a result of an evaluation test.

As illustrated in FIG. 12, also in the first modification example, as in the above embodiment, between the electromagnetic wave generating unit 11 that has electromagnetic wave generating portion in an annular shape and a plastic lens 88, which is a resin body, a distribution adjusting unit 14 that has an opening 15 in an annulus shape is provided. Moreover, in the first modification example, a distance adjusting unit 90 for moving (vertically) the electromagnetic wave generating unit 11 and the distribution adjusting unit 14 with regard to the installing unit 50 is provided. To the distance adjusting unit 90, various configurations can be applied. In the first modification example, a rack and pinion mechanism is applied as the distance adjusting unit 90. The dyeing device 1 drives the rack and pinion mechanism by rotating a distance adjusting motor, which is not illustrated. However, the rack and pinion mechanism may be manually driven by the operator.

If the distance D between the distribution adjusting unit 14 and the plastic lens 88 is short, the beam of the electromagnetic wave passing through the opening 15 is not quite diffused, and strongly applied on the vicinity of the outside periphery of the plastic lens 88. As a result, the temperature rise rate in the vicinity of the outside periphery of the plastic lens 88 is higher than the temperature rise rate of the center. Meanwhile, if the distance D is long, the beam of the electromagnetic wave passing through the opening 15 is in a state where the diffusion is advanced at the time when reaching the plastic lens 88. If the beam of the electromagnetic wave passing through the opening 15 in a circular shape is diffused, on the center of the plastic lens 88, the diffused electromagnetic wave overlaps. As a result, the temperature rise rate of the center with regard to the vicinity of the outside periphery is higher compared to the case where the distance D is short. As described above, the dyeing device 1 of the first modification example is capable of, by changing the distance between the distribution adjusting unit 14 and the installing unit 50 by the distance adjusting unit 90, dynamically changing the strength distribution of the electromagnetic wave applied on the plastic lens 88. In addition, the dyeing device 1 may change the strength distribution of the electromagnetic wave by changing a distance P between the electromagnetic wave generating unit 11 and the distribution adjusting unit 14. By changing the distance between the electromagnetic wave generating unit 11 and the distribution adjusting unit 14, and the distance between the distribution adjusting unit 14 and the installing unit 50, the strength distribution may be changed. In addition, by vertically moving the installing unit 50, the distance may be adjusted.

Moreover, the dyeing device 1 of the first modification example adjusts, in the S21 and S22 (refer to FIG. 11), the distance D in accordance with input lens information. As an example, in the case where the lens information indicating that the type of the plastic lens 88 is a minus lens is input, the distance D is shorter compared to the case where information indicating that the type of the plastic lens 88 is a plus lens is input. Therefore, the dyeing device 1 of the first modification example is capable of irradiating the electromagnetic wave by the appropriate strength distribution in accordance with the lens parameter on the plastic lens 88.

In addition, in the case where the output of the electromagnetic wave generating unit 11 is constant, the longer the distance P (not illustrated) between the electromagnetic wave generating unit 11 and the plastic lens 88 provided in the installing unit 50 becomes, the weaker the electromagnetic wave that reaches the plastic lens 88 becomes. Therefore, the temperature rise ratio of the plastic lens 88 changes in accordance with the distance P. In this case, it is difficult to keep the dyeing quality of the plastic lens 88 constant. The dyeing device 1 of the first modification example controls, even if the distance P is changed, so that the temperature rise ratio of the plastic lens 88 is approximately uniform, the output of the electromagnetic wave generating unit 11 in accordance with the distance P (voltage). More specifically, the CPU 70 of the dyeing device 1 controls, in the case where the distance P is increased, the output of the electromagnetic wave generating unit 11 to the output equal to or more than the output before the distance P is increased (that is, the longer the distance P becomes, the greater the output becomes). In addition, in the case where the distance P is shortened, the output of the electromagnetic wave generating unit 11 is controlled to the output equal to or less than the output before the distance P is shortened (that is, the shorter the distance P becomes, the smaller the output becomes). Therefore, the dyeing device 1 of the first modification example is capable of suppressing the generation of the difference of the temperature rise ratio of the resin body in accordance with the distance P.

In addition, in the case of adjusting the output of the electromagnetic wave generating unit 11 in accordance with the distance P, a specific output adjusting method can be appropriately set. For example, a CPU 70 may increase the output in proportion to the distance P. The output may also be gradually increased every time the distance P increases for a certain amount. In addition, a method of exchanging the strength distribution by switching the opening 15 (the method exemplified in the above embodiment) and the method of exchanging the strength distribution by switching the distance D (the method exemplified in the first modification example) may be performed at the same time. In this case, the dyeing device 1 is capable of adjusting the strength distribution of the electromagnetic wave more accurately.

[Assessment Test]

The inventor of the present disclosure performed an assessment test in order to check whether the irradiation distribution of the electromagnetic wave can be adjusted by the distribution adjusting unit 14 that includes the opening 15. In this assessment test, the inventor arranged, as illustrated in FIG. 12, the opening 15 formed in the distribution adjusting unit 14 between the electromagnetic wave generating unit 11 and the plastic lens 88. Next, the inventor fixed the distance between the electromagnetic wave generating unit 11 and the distribution adjusting unit 14 to 20 mm and measured the temperature of each part of the plastic lens 88 in the case where the distance between the distribution adjusting unit 14 and the plastic lens 88 is 30 mm, 40 mm, 50 mm, 60 mm, and 70 mm. The timing of the temperature measurement is the time when 300 seconds passed after heating start by the electromagnetic wave. The above test is performed with regard to the plastic lens 88 in two types with different shapes.

In addition, of the part of which the temperature is measured, an A part is the center of the plastic lens, a B part is the position 20 mm away from the center, and a C part is the position 35 mm away from the center (that is, the vicinity of the outer periphery). In addition, the diameter of the two types of the plastic lens 88 is both approximately 70 mm. However, the thickness of each part is different between the two types of the plastic lens 88. More specifically, in a plastic lens 88 with (CR S-0.00), the thickness of the A part is 2.30 mm, the thickness of the B part is 2.30 mm, and the thickness of the C part is also 2.30 mm. In the plastic lens 88 with (CR S-4.00), the thickness of the A part is 1.80 mm, the thickness of the B part is 3.45 mm, and the thickness of the C part is 7.25 mm. Even if the distance D between the distribution adjusting unit 14 and the plastic lens 88 is changed, so that the temperature of the plastic lens 88 is approximately uniform, the voltage of the electromagnetic wave generating unit 11 is adjusted in accordance with the distance D between the distribution adjusting unit 14 and the plastic lens. The result of the assessment test is illustrated in FIG. 13.

As illustrated in FIG. 13, regardless of the type of the plastic lens 88, the shorter the distance D is, the temperature rise rate in the vicinity of the outside periphery is higher than the temperature rise rate of the center. In addition, the longer the distance D is, the temperature rise rate in the vicinity of the outside periphery is lower than the temperature rise rate of the center. The reason thereof is that, in accordance with the shape of the opening 15 of the distribution adjusting unit 14, the position of the distribution adjusting unit 14, and the like, the strength distribution of the electromagnetic wave applied on the plastic lens 88 is determined. Therefore, the dyeing device 1 is capable of, by changing the distance D, the strength distribution of the electromagnetic wave. In addition, the dyeing device 1 is also capable of, by switching the openings 15A and 15B (refer to FIG. 3), the strength distribution of the electromagnetic wave.

In the plastic lens 88 with (CR S-0.00), the thickness of each part is constant. In contrast, in the plastic lens 88 with (CR S-4.00), since the thickness of the center is smaller than the thickness of the vicinity of the outer periphery, and the temperature of the center is likely to rise than that of the vicinity of the outer periphery. If the result of the assessment test is considered, the temperature rise rate of the center is higher with (CR S-4.00) than with (CR S-0.00). Therefore, in order to allow the temperature rise rate of each part in the plastic lens 88 to be uniform and to improve the quality of the dyeing, it is preferable that the strength distribution of the electromagnetic wave is appropriately changed in accordance with the shape of the plastic lens 88. According to the result of the assessment test, with (CR S-0.00), in the case where the distance D is from 48 to 49 mm, the temperature rise rate of each part is considered to be as uniform as possible. In addition, with (CR S-4.00), in the case where the distance D is 45 mm, the temperature rise rate of each part is considered to be as uniform as possible. However, in the case of only dyeing the plastic lens 88 in one shape or the like, the strength distribution of the electromagnetic wave is not needed to dynamically change. That is, "to adjust the strength distribution of the electromagnetic wave" not only mean to dynamically change the strength distribution, but also, in order to irradiate the electromagnetic wave with appropriate strength in accordance with the part of the resin body, means to statically adjust the strength distribution. In addition, as described above, the method of adjusting the strength distribution of the electromagnetic wave is not limited to the method of changing the distance D, and the method of switching the openings 15A and 15B and the like can be applied.

With reference to the FIG. 14, a second modification example of the embodiment will be described. The distribution adjusting unit 14 according to the above embodiment adjusts the strength distribution of the electromagnetic wave generated by the electromagnetic wave generating unit 11 by the opening 15. Meanwhile, in the second modification example illustrated in FIG. 14, the dyeing device 1 adjusts, by a reflecting unit 92 that reflects at least a part of the electromagnetic wave generated by the electromagnetic wave generating unit 11, the strength distribution of the electromagnetic wave applied on the plastic lens 88.

Figure 14:
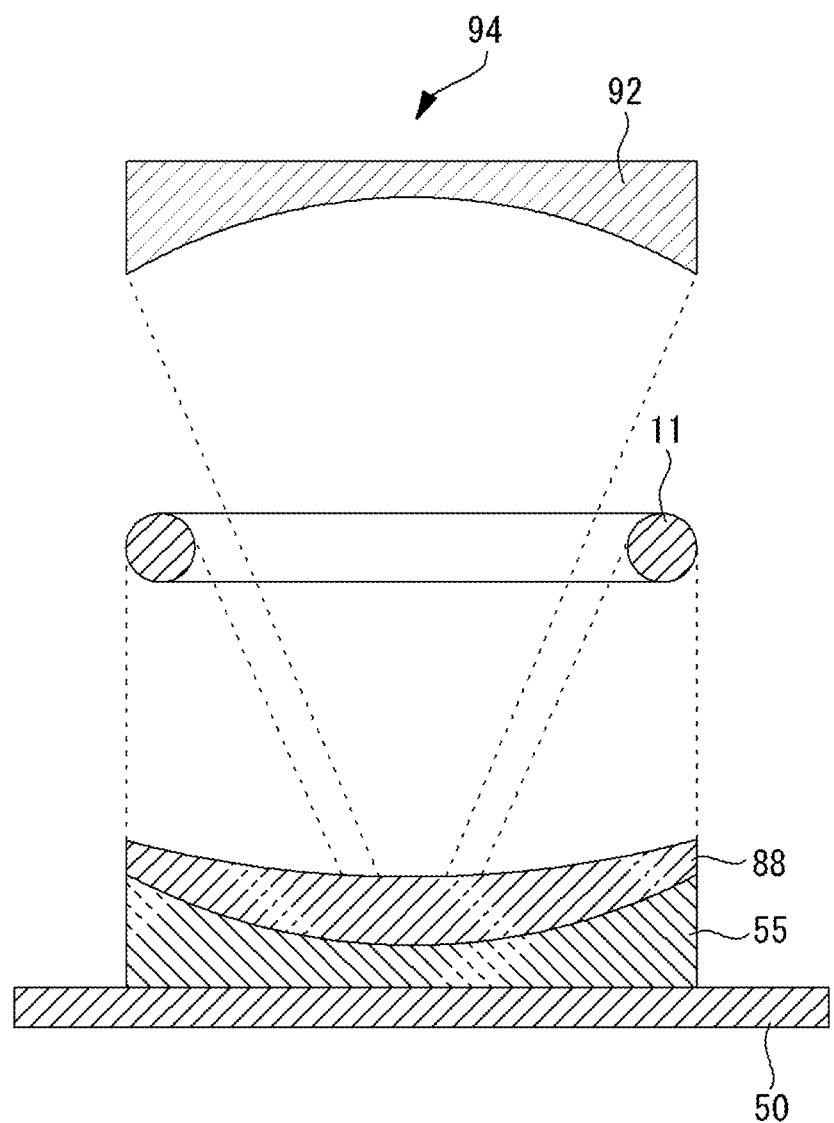
FIG. 14 is a view for illustrating a distribution adjusting unit 94 included in the dyeing device 1 according to a second modification example.

As illustrated in FIG. 14, in the distribution adjusting unit 94 of the second modification example, at the position opposite to the plastic lens 88 related to the electromagnetic wave generating unit 11 (that is, on the upper side of the electromagnetic wave generating unit 11), the reflecting unit 92 is provided. The surface on the side facing the electromagnetic wave generating unit 11 of the reflecting unit 92 (that is, the lower side surface) reflects the electromagnetic wave generated by the electromagnetic wave generating unit 11. In this embodiment, the lower side surface of the electromagnetic wave generating unit 11 is formed in a spherical shape of which the upper part is concave (a concave surface shape). Therefore, the electromagnetic wave irradiated from the electromagnetic wave generating unit 11 on the reflecting unit 92 is reflected to the lower side by the reflecting unit 92. The beam diameter of the reflected electromagnetic wave becomes slowly short toward the lower side. Therefore, the strength of the electromagnetic wave reflected by the reflecting unit 92 and applied on the plastic lens 88 is greater on the center part than on the outside of the plastic lens 88. Meanwhile, the strength of the electromagnetic wave contacted with the lower side from the electromagnetic wave generating unit 11 is greater on the outside than on the center part the plastic lens 88. Therefore, the dyeing device 1 of the second modification example is capable of, by using the reflecting unit 92 of the distribution adjusting unit 94, appropriately adjusting the strength distribution of the electromagnetic wave applied on the plastic lens 88. In addition, the dyeing device 1 of the second modification example is capable of, by using the reflecting unit 92, efficiently irradiating the electromagnetic wave generated by the electromagnetic wave generating unit 11 on the plastic lens 88.

In addition, the dyeing device 1 of the second modification example includes a configuration that changes the distance between the plastic lens 88 and the reflecting unit 92. That is, the dyeing device 1 of the second modification example vertically moves at least one of the plastic lens 88 and the reflecting unit 92. By changing the distance between the plastic lens 88 and the reflecting unit 92, the strength distribution of the electromagnetic wave reflected on the reflecting unit 92 and applied on the plastic lens 88 changes. Therefore, the dyeing device 1 of the second modification example is capable of dynamically changing the strength distribution of the electromagnetic wave applied on the plastic lens 88.

In addition, it is needless to say, the dyeing device 1 is capable of appropriately change the position and shape of the reflecting unit 92. For example, the shape of the reflecting unit 92 at the side facing the electromagnetic wave generating unit 11 may be, in accordance with the state of the heating performed, changed to be other shapes such as a flat board shape, a conical shape, or the like. The reflecting unit 92 may be positioned on the electromagnetic wave generating unit 11 side. A configuration in which the reflecting unit 92 is switched to the reflecting unit 92 in a different shape may be included.

In addition, the distribution adjusting unit 14 described in the above embodiment and the modification examples is an example. That is, it is also possible to change the configuration for adjusting the strength distribution of the electromagnetic wave. For example, by adjusting the arrangement of the plurality of infrared light heaters, the strength distribution may be adjusted. In addition, by adjusting the output of each of the plurality of infrared light heaters, the strength distribution may be adjusted. As an example, in the case where the strength of the electromagnetic wave applied on the center part of the plastic lens is greater than on the outer periphery, on the center part of the electromagnetic wave generating unit 11, the infrared light heater may be arranged at the density higher than on the outer periphery. In addition, the output of the infrared light heater arranged on the center part of the electromagnetic wave generating unit may be higher than the output of the infrared light heater arranged on the outer periphery.

In addition, in the above embodiment and the modification examples, the case where the plastic lens of a constant shape and in a radial pattern is heated is exemplified. That is, in the case of allowing the plastic lens to rotate centering on the axis passing through the geometric center of the lens perpendicular to the lens surface, in the plastic lens according to the above embodiment and the modification examples, the rotation becomes symmetrical at any angle. Therefore, the opening 15 is not in an elliptic shape but in a perfectly round shape, and the reflecting unit 92 is in a uniform spherical shape. However, even in the case where the resin body of a radially non-uniform shape and (for example, a toric lens including a columned component) is heated, the present disclosure can be applied. In this case, for example, the dyeing device 1 may adjust, by arranging a cylinder lens as the distribution adjusting unit between the electromagnetic wave generating unit 11 and the resin body, the strength distribution of the electromagnetic wave applied on the resin body may be adjusted. In this case, by including the mechanism rotating the cylinder lens or the mechanism moving the cylinder lens, it is possible to more appropriately adjust the strength distribution of the electromagnetic wave in accordance with the shape of the resin body. In addition, in the case where the resin body of a radially non-uniform shape and is heated, the shape of the opening 15 of the distribution adjusting unit 14 may be in an elliptic shape. By irradiating the electromagnetic wave while changing the positional relationship between the electromagnetic wave generating unit 11 and the resin body, the strength distribution of the electromagnetic wave may be adjusted.

In addition, it is also possible to use two or more of the plurality of the distribution adjusting units described above by combining the distribution adjusting units. For example, the strength distribution of the electromagnetic wave may be adjusted by using both of the opening 15 exemplified in the above embodiment and the reflecting unit 92 exemplified in the second modification example. In this case, it is preferable to consider both of the strength distribution adjusted by the opening 15 and the strength distribution adjusted by the reflecting unit 92 and set the shape, position, and the like of the both. By combining the plurality of distribution adjusting units, the strength distribution of the electromagnetic wave is more appropriately adjusted.

As described above, the dyeing device 1 according to the above embodiment, the pressure inside the closed chamber 20 is lowered by the pump 31 (S27). The dyeing device 1 sublimates, in the state where the dyeing base 57 faces the resin body without contact, by heating the dye adhered to the dyeing base 57 inside the closed chamber 20 of which the pressure is lowered, the dye and vaporizes and deposits the dye on the resin body (S28). The dyeing device 1 heats, in the state where the pressure surrounding the resin body is raised higher than the pressure at the vaporizing and depositing time, by irradiating the electromagnetic wave on the resin body on which the dye is vaporized and deposited, the resin body and fixes the dye (S30, S36). Therefore, the dyeing device 1 is capable of lowering the possibility of the dye vaporized and deposited on the resin body sublimating again during the step of fixing compared to the case of performing the step of fixing under low pressure (for example, the case of performing vaporizing and depositing and fixing at the same time). Therefore, the dyeing device 1 is capable of stabilizing and performing the dyeing according to the gas phase transcription dyeing method with one device.

In the above embodiment, by the electromagnetic wave generating unit 11, both heating at the vaporizing and depositing time and heating at the fixing time are performed. Therefore, the dyeing device 1 has an easy configuration and can be easily miniaturized. The cost for introducing equipment is also lowered.

In the above embodiment, the electromagnetic wave generating unit 11 is provided on the outside of the closed chamber 20. Therefore, the dyeing device 1 is capable of lowering the possibility of a defect generated in the electromagnetic wave generating unit 11 due to the lowered pressure inside the closed chamber 20. There is no need to apply the electromagnetic wave generating unit 11 with high resistance against pressure.

In the above embodiment, of the closed chamber 20, at the part between the resin body provided in the installing unit 50 and the electromagnetic wave generating unit 11, the transmitting unit 25 in which the electromagnetic wave penetrates is provided. Therefore, the dyeing device 1 is capable of efficiently applying heat energy from the electromagnetic wave generating unit 11 provided on the outside of the closed chamber 20 to the inside of the closed chamber 20. That is, the dyeing device 1 is capable of efficiently performing vaporizing and depositing and fixing while lowering the possibility of a defect generated in the electromagnetic wave generating unit 11 due to the lowered pressure. There is also no need for steps for opening a part of the closed chamber 20.

The dyeing device 1 according to the above embodiment includes the retracting mechanism 60. The retracting mechanism 60 retracts the dyeing base 57 from the position of being heated by the electromagnetic wave generating unit 11. The dyeing device 1 is capable of, by performing the step of fixing in the state where the dyeing base 57 is retracted by the retracting mechanism 60, preventing the dyeing quality of the resin body from being lowered due to burning, deformation, or the like generated in the dyeing base 57 during the step of fixing.

The dyeing device 1 according to the above embodiment includes the retracting motor 82 that drives the retracting mechanism 60. The CPU 70 controls the retracting motor 82 and performs the step of fixing in the state where the dyeing base 57 is retracted. Therefore, the dyeing device 1 is capable of performing the step of fixing from the step of vaporizing and depositing to the step of fixing without causing the operator to perform an operation for retracting the dyeing base 57.

The dyeing device 1 according to the above embodiment and the modification examples adjusts the strength distribution of the electromagnetic wave applied on the resin body by the distribution adjusting units 14 and 94. Therefore, it is possible to irradiate the electromagnetic wave with appropriate strength on each part of the resin body. Therefore, the dyeing device 1 is capable of appropriately controlling the temperature rise of each part of the resin body while heating the resin body by the irradiation of the electromagnetic wave to fix the dye.

If the step of fixing is appropriately performed by the irradiation of the electromagnetic wave, various effects can be obtained. For example, the dyeing device 1 is capable of, compared to the case where other heating means such as an oven are used, heating the resin body for a short time. Miniaturizing of the device main body is also facilitated. In addition, the dyeing device 1 according to the above embodiment is capable of performing the step of vaporizing and depositing and the step of fixing in one electromagnetic wave generating unit 11. Moreover, by scanning the beam of the electromagnetic wave, a method of suppressing the temperature rise of each part of the resin body can be considered. However, since the configuration and control for scanning the beam of the electromagnetic wave are complex, it is difficult to shorten the dyeing time. In contrast, the dyeing device 1 according to the above embodiment, it is possible to control the temperature rise of the resin body with an easy configuration, and thus the dyeing time can be shortened compared to the related art.

The distribution adjusting unit 14 according to the above embodiment includes the opening 15 that allows at least a part of the electromagnetic wave to pass through. In this case, the dyeing device 1 is capable of, by allowing the electromagnetic wave to pass through the opening 15, easily and appropriately adjusting the strength distribution of the electromagnetic wave. In addition, the opening 15 according to the above embodiment is formed in an annular shape. The dyeing device 1 is capable of, by allowing the electromagnetic wave to pass through the opening 15 of the distribution adjusting unit 14, easily adjusting the strength of the center part in the beam of the applied electromagnetic wave and the strength of the surrounding part with an easy configuration.

In the above embodiment, a generating unit that generates the electromagnetic wave in the electromagnetic wave generating unit 11 is formed in an annular shape in accordance with the shape of the opening 15. Therefore, the dyeing device 1 is capable of, compared to the case where the electromagnetic wave generating portion that has a generating unit in other shapes such as a spherical shape, a surface shape, or the like is used, efficiently irradiating the electromagnetic wave from the opening 15 on the resin body.

The adjusting unit mounting gear 18 according to the above embodiment detachably mounts each of the plurality of the distribution adjusting units 14, which are different from each other either in the size or the shape of the opening 15. Therefore, the operator can, by mounting the distribution adjusting unit 14 that has the opening 15 proper for the shape or the like of the resin body by the adjusting unit mounting gear 18, appropriately adjust the temperature rise of each part of the resin body.

In the distribution adjusting unit 14 according to the above embodiment, the plurality of the openings 15A and 15B, which are different from each other either in the size or the shape, is formed. In the dyeing device 1, by the distribution adjusting unit 14 being rotated and the posture thereof being switched, among the plurality of the openings 15A and 15B, the openings 15A and 15B that adjust the strength distribution of the electromagnetic wave are switched. Therefore, the operator can, by only switching the posture of the distribution adjusting unit 14, easily adjust the temperature rise of each part of the resin body. In addition, the dyeing device 1 according to the above embodiment switches the opening 15 in accordance with the parameter of the resin body (in the above embodiment, the lens information). Therefore, the dyeing device 1 is capable of, without causing the operator to perform many operations, irradiating the electromagnetic wave on the resin body by using a proper opening 15 in accordance with the resin body.

The dyeing device 1 of the first modification example (refer to FIG. 12) includes the distribution adjusting unit 90 that changes the distance between the distance adjusting unit 14 and the installing unit 50. The dyeing device 1 of the first modification example is capable of, by driving the distance adjusting unit 90, dynamically changing the strength distribution of the electromagnetic wave applied on the resin body. Therefore, the dyeing device 1 is capable of appropriately controlling the temperature rise of each part of the resin body. In addition, the dyeing device 1 of the first modification example changes the distance between the distance adjusting unit 14 and the installing unit 50 in accordance with the input lens information. Therefore, without causing the operator to perform many operations, it is possible to adjust the strength distribution of the electromagnetic wave in accordance with the lens. In addition, the dyeing device 1 of the first modification example controls the output of the electromagnetic wave generating unit 11 in accordance with the distance between the electromagnetic wave generating unit 11 and the installing unit 50. Therefore, it is possible to suppress the generation of the difference of the temperature rise ratio of the resin body in accordance with the distance between the electromagnetic wave generating unit 11 and the resin body. Therefore, it is difficult for the difference to be generated in the dyeing quality.

The dyeing device 1 of the second modification example (refer to FIG. 13) includes the reflecting unit 92 in the distribution adjusting unit 94. The reflecting unit 92 adjusts, by reflecting at least a part of the electromagnetic wave generated by the electromagnetic wave generating unit 11 and changing a propagation direction, the strength distribution of the electromagnetic wave applied on the resin body. Therefore, the dyeing device 1 of the second modification example is capable of appropriately adjusting the strength distribution of the electromagnetic wave with an easy configuration. In addition, the dyeing device 1 of the second modification example is capable of, by adjusting the distance between the installing unit 50 and the reflecting unit 92, dynamically changing the strength distribution. By adjusting the distance in accordance with the parameter of the resin body, it is possible to irradiate the electromagnetic wave with the strength distribution proper for the resin body on the resin body.

Hereinafter, the temperature rise rate of each part of the resin body will be mentioned. If the resin body is heated by irradiating electromagnetic wave such as infrared light, due to the effect of the shape or the like of the resin body, there is a case where a difference is generated in the temperature rise ratio of each part of the resin body. For example, in order to uniformly heat the resin body in a substantially plate shape, the case of uniformly irradiating the electromagnetic wave on the plate surface of the resin body is assumed. In this case, if the thickness of the resin body is not constant, since the temperature of the thicker part is difficult to rise than the temperature of the thin part, the temperature difference is generated in each part of the resin body. If the resin body cannot be heated uniformly, there is a possibility of a defect such as color spots generating. That is, suppressing the generation of the difference in the temperature rise of each part of the resin body while heating the resin body by the irradiation of the electromagnetic wave to fix the dye is difficult with the related art.

The manufacturing method of a dyeing resin body illustrated in the above embodiment is a manufacturing method of manufacturing the dyeing resin body, by heating a resin body on the surface of which a dye is adhered to fix the dye to the resin body, and includes an adhering step of adhering the attachment body adhesive with regard to the resin body on the resin body, and a fixing step of fixing the dye the resin body for heating the resin body to fix the dye, with regard to the resin body on which the attachment body is adhered in the adhering step, by irradiating electromagnetic wave from the electromagnetic wave generating means that generates the electromagnetic wave. Therefore, even in the case where the temperature of a part of the resin body is higher than the temperature of other parts, since the heat is diffused to the attachment body 55, the generation of the temperature difference is suppressed. Therefore, it is possible to suppress the generation of the difference of the temperature rise ratio of each part of the resin body while heating the resin body by irradiation of the electromagnetic wave to fix the dye.

The thermal conductivity of the attachment body 55 exemplified in the above embodiment is equal to or more than the thermal conductivity of the resin body. Therefore, the heat locally generated in the resin body is efficiently diffused to the attachment body 55. Therefore, according to the manufacturing method according to the above embodiment, it is possible to more efficiently control the temperature rise radio of each part of the resin body.

The manufacturing method exemplified in the above embodiment further includes a vaporizing and depositing step in which, in the state where, to the resin body on which the attachment body is adhered in the adhering step, the adhesion surface of a dyeing base on which the sublimation dye is adhered is faced in a substantially vacuum state without contact, by heating and sublimating the dye adhered to the dyeing base, the dye is vaporized and deposited on the resin body. The adhering step is a step of, in a state where the attachment body is contacted with the resin body, by lowering the pressure of a space in which the attachment body and resin body exist, adhering the attachment body to the resin body. That is, by only lowering the pressure in the state where the attachment body 55 is contacted with the resin body, a space in a substantially vacuum state required for vaporization and deposition is formed and the attachment body 55 is also adhered to the resin body. Therefore, the operator or the dyeing device 1 does not need to perform a step of pressing the attachment body 55 against the resin body or the like.

The manufacturing method exemplified in the above embodiment further includes a base creating step in which, by adhering a material for dyeing in which the sublimation dye is subjected to dissolution or fine particle dispersion on a base based on color data set in an electronic computer, the dyeing base is created. Therefore, since the dye is adhered on the accurate position of the dyeing base 57, the dyeing resin body with higher quality can be obtained. Moreover, the operator can easily and freely set the state of dyeing (design) with the electronic computer.

In the above embodiment, the resin body is the plastic lens. The material of the attachment body 55 is silicon with hardness from three to 30 degrees. In the attachment body 55, the thickness of the part on which the plastic lens is at least carried is from 1 mm to 10 mm. In this case, the attachment body 55 is easily adhered to the resin body. Therefore, it is possible to more effectively decrease the temperature difference in each part of the resin body. In addition, in the attachment body 55, the curvature radius of the carrying surface on which the resin body is carried is from 50 mm to 200 mm. In this case, sufficient contact area of the attachment body 55 and the resin body is secured, and the attachment body 55 is easily adhered to the resin body.

The dyeing device 1 exemplified in the above embodiment is also capable of expressing as follows. The dyeing device is a device that, by heating the resin body on the surface of which the dye is adhered, fixes the dye adhered to the surface of the resin body to dye the resin body to dye the resin body, and includes an installing unit in which the resin body is provided and the electromagnetic wave generating means that generates electromagnetic wave with regard to the resin body provided in the installing unit, while the installing unit includes, in the part contacting with the resin body, an attachment body mounting unit in which an attachment body that has adhesiveness with regard to the resin body is mounted.

Various changes can be added to the above embodiment and the modification examples. The dyeing device 1 according to the above embodiment performs the step of vaporizing and depositing and the step of fixing by using the electromagnetic wave generating unit 11. As a result, the configuration is simplified. However, it is also possible to separately provide the means for heating the dye of the dyeing base 57 at the vaporizing and depositing time and the means for heating the resin body by the electromagnetic wave at the fixing time. Also in this case, the dyeing device 1 is capable of, by performing the step of fixing under higher pressure than the pressure at the vaporizing and depositing time, performing stable dyeing with one device. Even in the dyeing device in which, if the heating means used in the step of vaporizing and depositing is in the dyeing device separately provided from the electromagnetic wave generating unit used in the step of fixing, it is possible to apply the configuration of the distribution adjusting unit 14. The configuration of the distribution adjusting unit 14 may be applied to the dyeing device that performs only the step of fixing. In addition, "The electromagnetic wave generating unit serves as the dye heating means and the resin body heating means" does not mean that the means for heating the dye of the dyeing base 57 at the vaporizing and depositing time and the means for heating the resin body by the electromagnetic wave at the fixing time are completely shared. For example, even in the case where the electromagnetic wave generating unit 11 is configured by the plurality of heaters, a part of the plurality of the heaters are used at the vaporizing and depositing time, and all of the plurality of the heaters are used at the fixing time, the configuration can be simplified. That is, if at least a part of the heating means at the vaporizing and depositing time and the heating means at the fixing time are shared, the configuration can be simplified.

The dyeing device 1 according to the above embodiment keeps, by providing the transmitting unit 25 in the closed chamber 20, the seal performance inside the closed chamber 20 while allowing the electromagnetic wave to penetrate the closed chamber 20 from the outside to the inside. Therefore, it is possible to efficiently heat the dye adhered to the dyeing base 57. However, it is also possible to heat the dye with the electromagnetic wave without providing the transmitting unit 25. For example, the dyeing device 1 may heat and sublimate, in the state where the dyeing base 57 is contacted with the plate surface of a steel plate, by heating the steel plate with electromagnetic wave, the sublimation dye of the dyeing base 57. In addition, considering the effect exerted by the change of pressure to the electromagnetic wave generating unit 11, it is preferable that the electromagnetic wave generating unit 11 is provided at the outside of the closed chamber 20. However, it is also possible to provide the electromagnetic wave generating unit 11 inside the closed chamber 20.

The dyeing device 1 according to the above embodiment proceeds, when the step of vaporizing and depositing is completed, by automatically retracting the dyeing base 57 by the retracting mechanism 60, to the step of fixing. Therefore, there is no need for the operator to retract the dyeing base 57. The time required for dyeing is also shortened. However, it is also possible for the operator to retract the dyeing base 57. In addition, for example, in the case where the dyeing base 57 in which burning, deformation, or the like is hard to be generated or the like is used, even if the step of fixing is performed without retracting the dyeing base 57, the quality of the dyeing is not likely to be lowered.

In the above embodiment, the case of performing dyeing on the plastic lens for glasses in a substantially disk shape is exemplified. However, the present disclosure can also be applied to the case of dyeing resin bodies other than the plastic lens. For example, the present disclosure can be applied to the case of dyeing various resin bodies such as the cover of a cell phone, the cover for the light of an automobile, an accessory, a toy, or the like. In addition, according to the gas transcription dyeing related to the present disclosure, regardless of whether coating is performed on the resin body to be dyed, high-quality dyeing can be performed. For example, in the case of dyeing the plastic lens for glasses, it is possible to perform water-resistant coating for obtaining water resistance, reflection preventing coating for preventing reflection of light, hard coating for preventing damage, primer coating for preventing a crack, and the like on the plastic lens before or after the dyeing. That is, in the case of performing coating on the resin body, "surface of the resin body" may be regarded as the surface of the coated layer or as the surface of the resin body itself positioned below the coated layer.

The opening 15 according to the above embodiment is formed in an annular shape. Therefore, the dyeing device 1 is capable of, adjusting the strength of the center part in the beam of the electromagnetic wave and the strength of the surrounding part with an easy configuration. However, even if the opening in a shape other than the annular shape, it is possible to adjust the strength distribution of the electromagnetic wave. For example, the opening not in an annular shape but in a round shape may be used. In addition, in the above embodiment, the shape of the generating portion of the electromagnetic wave is also in an annular shape in accordance with the shape of the opening 15. Therefore, the dyeing device 1 is capable of efficiently irradiating the electromagnetic wave from the opening 15 on the resin body. However, even if the shape of the electromagnetic wave generating part is changed, by using the distribution adjusting unit 14, the strength distribution of the electromagnetic wave is appropriately adjusted.

As in the above embodiment, it is preferable that the distribution adjusting unit 14 is detachably mounted on the dyeing device 1. However, the distribution adjusting unit 14 that is not detachable may be used. Also in this case, if the configuration in which the plurality of the openings 15A and 15B are switched, or the configuration in which the distance between the members is adjusted (refer to FIG. 12) is used, it is possible to change the strength distribution of the electromagnetic wave. In addition, as in the above embodiment, by providing the plurality of the openings 15A and 15B in the distribution adjusting unit 14, it is possible to easily switch the openings 15A and 15B for use. However, it is also possible to provide only one opening 15 in the distribution adjusting unit 14.

The dyeing device 1 according to the above embodiment includes the adjusting unit rotating motor 80 for switching the opening 15 for use. Therefore, there is no need for the operator to switch the opening 15. However, even in the case where the operator manually switches the opening 15, it is possible to dynamically change the strength distribution of the electromagnetic wave. In addition, in the above embodiment and the modification examples, the electromagnetic wave generating unit 11 is provided on the upper side of the resin body and the dyeing base 57 and the electromagnetic wave is applied on the resin body and the dyeing base 57 from the upper side. However, the positional relationship of various configurations may be changed. For example, it is also possible to irradiate the electromagnetic wave from the lower side, the lateral side, or the diagonal side of the resin body and the dyeing base.

In the above embodiment, the same opening 15 used as in the step of vaporizing and depositing and the step of fixing is used. However, the dyeing device 1 may change, in the step of vaporizing and depositing and the step of fixing, the strength distribution of the electromagnetic wave by the change of the opening 15 or the like. In this case, the dyeing device 1 is capable of realizing the strength distribution of the appropriate electromagnetic wave for heating the dye of the dyeing base 57 and the strength distribution of the appropriate electromagnetic wave for heating the resin body by using the same electromagnetic wave generating unit 11. Therefore, it is possible to perform dyeing according to the gas phase transcription dyeing method more smoothly. In addition, in order to appropriately control the temperature of the resin body, it is preferable to use at least one of the distribution adjusting unit 14 and the attachment body 55. However, the present disclosure can be realized without using the distribution adjusting unit 14 and the attachment body 55.

The dyeing device 1 according to the above embodiment, by using the distribution adjusting unit 14, the generation of the difference of the temperature rise ratio of each part of the resin body can be suppressed. Therefore, it is possible to perform the step of fixing by heating the resin body uniformly, and to improve the quality of dyeing. However, the case where the distribution adjusting unit 14 can be applied is not limited to the case of heating the resin body uniformly. For example, even in the case where the temperature rise ratio of a part of the resin body is intentionally allowed to be higher than that of other parts, the distribution adjusting unit 14 can be applied.

The installing unit 50 according to the above embodiment includes the attachment body mounting unit 52 on which the attachment body 55 is mounted. Therefore, the dyeing device 1 is capable of suppress the generation of the temperature difference of each part of the resin body by the attachment body 55 adhered to the resin body. However, the dyeing device 1 may not include the attachment body mounting unit 52. In addition, the operator may provide, after the attachment body 55 is adhered to the resin body in advance, the resin body to which the attachment body 55 is adhered in the installing unit 50.

In the above embodiment, the pressure inside the closed chamber 20 in the state where the attachment body 55 is adhered to the resin body is lowered. Therefore, the operator or the dyeing device 1 does not need to separately perform a step of pressing the attachment body 55 against the resin body or the like. However, the operator or the dyeing device 1 may separately perform the step of adhering the attachment body 55 on the resin body. In this case, the attachment body 55 is more surely adhered to the resin body.

The invention claimed is:

1. A dyeing device for dyeing a resin body by vaporizing and depositing a sublimation dye adhered to a dyeing base to the resin body and fixing the dye to the resin body, comprising:
a closed chamber that closes at least a periphery of the resin body provided in an installing unit;
a pressure lowering device configured to lower pressure inside the closed chamber;
a heating unit configured to heat the dye adhered to the dyeing base and configured to heat the resin body;
a processor; and
memory storing a program, when executed by the processor, causing the dyeing device to execute:
a pressure lowering controlling instruction of lowering the pressure inside the closed chamber by using the pressure lowering device;
a vaporization and deposition controlling instruction of vaporizing and depositing the dye on the resin body by heating, by the heating unit, the dye adhered to the dyeing base inside the closed chamber of which pressure is lowered, according to the pressure lowering controlling instruction, to sublimate the dye in a state where an adhesion surface of the dyeing base to which the dye is adhered faces the resin body without contact; and
a fixation controlling instruction of fixing the dye by irradiating the resin body on which the dye is vaporized and deposited with electromagnetic wave from the heating unit to heat the deposited dye and the resin body in response to the pressure of the periphery of the resin body rises at the time of fixation is higher than the pressure at a vaporizing and depositing time according to the vaporization and deposition controlling instruction,
wherein the heating unit includes an electromagnetic wave generator configured to generate the electromagnetic wave to heat the dye and the resin body.

2. The dyeing device according to claim 1, wherein a transmitting unit configured to allow the electromagnetic wave to penetrate is provided at least at a part of the closed chamber between the resin body provided in the installing unit and the electromagnetic wave generator.

3. The dyeing device according to claim 1, further comprising a retracting unit configured to retract the dyeing base from a position heated by the heating unit.

4. The dyeing device according to claim 3 further comprising a retraction driver configured to drive the retracting unit,
wherein the fixation controlling instruction causes the heating unit to irradiate the resin body with the electromagnetic wave in the state where the retraction driver is controlled to retract the dyeing base.

5. A dyeing device for dyeing a resin body by vaporizing and depositing a sublimation dye adhered to a dyeing base to the resin body and fixing the dye to the resin body, comprising:
a closed chamber that closes at least a periphery of the resin body provided in an installing unit;
a pressure lowering device configured to lower pressure inside the closed chamber;
a heating unit, including an electromagnetic wage generator, configured to heat the dye adhered to the dyeing base and configured to heat the resin body;
a processor; and
memory storing a program, when executed by the processor, causing the dyeing device to execute:

a pressure lowering controlling instruction of lowering the pressure inside the closed chamber by using the pressure lowering device;

a vaporization and deposition controlling instruction of vaporizing and depositing the dye on the resin body by heating, by the heating unit, the dye adhered to the dyeing base inside the closed chamber of which pressure is lowered, according to the pressure lowering controlling instruction, to sublimate the dye in a state where an adhesion surface of the dyeing base to which the dye is adhered faces the resin body without contact; and a fixation controlling instruction of fixing the dye by irradiating the resin body on which the dye is vaporized and deposited with electromagnetic wave from the heating unit to heat the deposited dye and the resin body in response to the pressure of the periphery of the resin body rises higher than the pressure at a vaporizing and depositing time according to the vaporization and deposition controlling instruction, wherein the electromagnetic wave generator includes a central opening.

6. The dyeing device according to claim 5, wherein the heating unit further includes a distribution adjusting unit, including at least one central opening, configured to adjust an electromagnetic wave generated by the electromagnetic wave generator, and wherein the central opening of the electromagnetic wave generator corresponds to a shape of the central opening of the distribution adjusting unit.

7. The dyeing device according to claim 1, further comprising a retracting unit configured to retract the dyeing base from a position heated by the heating unit in a direction having a lateral component.

* * * * *